US011599701B1

(12) United States Patent
Ginetti

(10) Patent No.: US 11,599,701 B1
(45) Date of Patent: Mar. 7, 2023

(54) METHOD, SYSTEM, AND COMPUTER PROGRAM PRODUCT FOR CHARACTERIZING ELECTRONIC DESIGNS WITH REAL-TIME MODELING

(71) Applicant: Cadence Design Systems, Inc., San Jose, CA (US)

(72) Inventor: Arnold Jean Marie Gustave Ginetti, Antibes (FR)

(73) Assignee: Cadence Design Systems, Inc.

( * ) Notice: Subject to any disclaimer, the term of this patent is extended or adjusted under 35 U.S.C. 154(b) by 0 days.

(21) Appl. No.: 17/138,861

(22) Filed: Dec. 30, 2020

(51) Int. Cl.
*G06F 30/392* (2020.01)
*G06F 30/398* (2020.01)

(52) U.S. Cl.
CPC .......... *G06F 30/392* (2020.01); *G06F 30/398* (2020.01)

(58) Field of Classification Search
CPC ........ G06F 30/39; G06F 30/33; G06F 30/392; G06F 30/30; G06F 30/367; G06F 30/327; G06F 30/394; G06F 30/398; G06F 30/331; G06F 2119/12; G06F 2111/08; G06F 2117/08; G06F 30/3312; G06F 30/333; G06F 30/36; G06F 2119/06; G06F 30/34; G06F 2115/08; G06F 30/20; G06F 2111/06; G06F 30/3323; G06F 17/14; G06F 2111/12; G06F 2119/18; G06F 30/343; G06F 13/22; G06F 13/4291; G06F 2111/02; G06F 2113/18; G06F 2113/20; G06F 2115/10; G06F 40/103; G06F 40/137; G06F 8/41; G06F 15/7864; G06F 2111/04; G06F 2111/20; G06F 30/35; G06F 30/396; G06F 7/544; G06F 7/57; G06F 9/3005; G06F 9/5011; G06F 1/10; G06F 12/0811; G06F 12/0817; G06F 12/0833; G06F 12/0862; G06F 12/0871; G06F 12/0888; G06F 12/126; G06F 15/7807; G06F 15/7825; G06F 15/7867; G06F 17/16; G06F 2212/1016; G06F 2212/601; G06F 30/18; G06F 30/27; G06F 30/31; G06F 30/3308; G06F 30/337; G06F 30/347; G06F 30/373; G06F 30/3953; G06F 8/4442;
(Continued)

(56) References Cited

U.S. PATENT DOCUMENTS 9,223,915 B1 * 12/2015 Ginetti ................. G06F 30/367
9,910,947 B1 * 3/2018 Kao ....................... G06F 30/367
(Continued)

OTHER PUBLICATIONS

Jereminov, M., et al. "Equivalent Circuit Programming for Power Flow Analysis and Optimization," IEEE, dated 2021.
(Continued)

*Primary Examiner* — Binh C Tat
(74) *Attorney, Agent, or Firm* — Vista IP Law Group, LLP

(57) ABSTRACT

Disclosed are methods, systems, and articles of manufacture for characterizing an electronic design with real-time modeling. An electronic design may be prepared for an analysis that programmatically sweeps across multiple values of a new parameter for multiple instances in the electronic design. The analysis may be performed on the electronic design at least by adding the new parameter to the analysis engine and by sweeping the new parameter across the multiple values to generate an analysis result. The electronic design may then be updated based at least in part upon the analysis result.

20 Claims, 21 Drawing Sheets

(58) Field of Classification Search
CPC ...... G06F 8/445; G06F 8/447; G06F 9/44505; G06F 9/4881; G06F 9/5016; G06F 9/52; G06F 2117/12; G01R 31/2849; G01R 31/2855; G06T 7/0006; G06T 2207/30148; G03F 1/84; G03F 1/36; G03F 1/70; G03F 1/76; G03F 7/70441; G03F 7/705; H01L 21/67005
USPC .................................................. 716/118–125
See application file for complete search history.

(56) References Cited

U.S. PATENT DOCUMENTS

| | | | |
|---|---|---|---|
| 10,178,080 B1* | 1/2019 | Khanna | G06Q 30/018 |
| 2015/0242554 A1* | 8/2015 | Dreibelbis | G06F 30/3312 |
| | | | 703/2 |
| 2018/0025106 A1* | 1/2018 | Chobanyan | G06F 30/398 |
| | | | 716/112 |
| 2019/0211475 A1* | 7/2019 | Ito | G06F 30/392 |

OTHER PUBLICATIONS

"Advanced Design System 2011.01: EM Simulation", Agilent Technologies, dated Feb. 2011.
Korn, G., "Advanced Dynamic-System Simulation Model Replication and Monte Carlo Studies," University of Arizona, Copyright 2013.
"S-Parameter Techniques for Faster, More Accurate Network Design," Hewlett Packard, dated Mar. 27, 2008.
"Simulation and Analysis Guide," National Instruments, NI AWR Design Environment v13 Edition, date found via Google as 2020.

* cited by examiner

METHOD, SYSTEM, AND COMPUTER PROGRAM PRODUCT FOR CHARACTERIZING ELECTRONIC DESIGNS WITH REAL-TIME MODELING

COPYRIGHT NOTICE

A portion of the disclosure of this patent document includes material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

A semiconductor integrated circuit (IC) has a large number of electronic components, such as transistors, logic gates, diodes, wires, etc., that are fabricated by forming layers of different materials and of different geometric shapes on various regions of a silicon wafer. Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high-level behavior description of the IC device and translates this high-level design description into netlists at various levels of abstraction using a computer synthesis process. A netlist describes interconnections of nodes and components on the chip and includes information of circuit primitives such as transistors and diodes, their sizes and interconnections, for example.

An integrated circuit designer may use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools.

Modern electronic designs proceed through a series of design implementation tasks prior to manufacturing. These design implementation tasks involve multiple rounds of analyses, simulation, verification, error fixes, optimizations, ECOs (Engineering Change Orders), etc. at various stages of the electronic design implementation in several different abstractions (e.g., schematic, layout, etc.) Analyzing an electronic circuit design include various simulations, statistical analyses (e.g., regression analysis, Monte-Carlo analysis, etc.), various checks and verifications (e.g., between a design specification and circuit behavior), etc.

Conventional approaches require designers to identify the schematic design of an electronic design, implement the schematic design in a layout, extract values (e.g., electromagnetic (EM) behaviors, s-parameters, parasitics, etc.) from the layout, annotate the schematic design, a schematic view, or a simulation view with the extracted values, and provide the annotated view or design to a simulator to predict whether the electronic design performs as designed. If the predicted behaviors of the electronic design do not meet requirements, designs need to perform one or more fixes and repeat the aforementioned steps. This repeated flow not only delays the time to market but also wastes unnecessary computing resources and thus presents a challenge to electronic design implementations.

Moreover, modern electronic designs may employ parameterized cells or pcells that model a circuit component in terms of one or more parameters. One or more corresponding values may be passed along into a parameterized cell or pcell during instantiation. Although various simulators may automatically sweep across a set or range of values for such a parameter captured in a parameterized cell or pcell, such sweeping capability is indeed limited by how complete the parameterized cell or pcell models the underlying circuit component. Often, designs find that a parameterized cell or pcell does not necessarily model one or more characteristics that may correspond to a specific set or range of values during implementation. As a result, simulators are thus unable to programmatically acquire this specific set or range of values, let alone sweep across the specific set or range of values. In order to sweep across this specific set or range of values, designers are thus required to manually specify this specific set or range of values. Considering the fact that an electronic design may contain a large number of parameterized cells and even more instances thereof, such manual efforts are not only inefficient and wasteful but also prone to human errors.

To further exacerbate the aforementioned challenges and shortcomings of conventional approaches, a circuit component in an electronic design may be affected by a parameter that corresponds to a range of values or a set of discrete values that is not captured in or reflected by a model representing the circuit component. Modern simulators provide some basic functions for the simulators to sweep across the range or set of values during simulation. Nonetheless, as such a parameter may not necessarily be captured in or reflected by the model representing the circuit component, simulators will not be able to automatically determine various configurations that respectively correspond to individual values in the range or set.

Moreover, a modern electronic design not only needs to satisfy various design and market requirements, which may be reflected in or captured by electronic designs or models therein, but also various requirements from, for example, foundries that eventually fabricate the underlying electronic design. For example, a foundry may impose a processing or manufacturing requirement that allows two instances to be spaced apart from each other with a continuous range or discrete set of spacing values rather than simply a minimum spacing value. As another example, a foundry may further impose one or more permissible orientation requirements for instances of a cell. These processing or manufacturing requirements often are not, however, captured or reflected at all or at least not completely captured or represented in a circuit model or in modern simulators so as to enable modern simulators to programmatically, automatically sweep across such a range or set of values.

Conventional approaches again require designers to manually define such a parameter, constraint, or requirement and specify a set or range of values therefor and provide parameter, constraint, or requirement as well as its set or range of values to the simulator for the simulator to sweep across the multiple values in the set or range. Given the multitude of such processing or manufacturing requirements (and different foundries may impose different constraints or requirements), especially when coupled to the numerous parameters that may not be captured in or reflected by various models, such manual efforts waste unnecessary computing resources, are prone to human errors, and cause undesirable delays in the implementations of electronic designs.

Therefore, there is a need for methods, systems, and computer program products for real-time modeling an electronic design in a more accurate, efficient, and/or effective manner as well as to address at least the aforementioned issues and shortcomings.

SUMMARY

Disclosed are method(s), system(s), and article(s) of manufacture for characterizing an electronic design with real-time modeling in one or more embodiments. Some embodiments are directed at a method for characterizing an electronic design with real-time modeling. These embodiments prepare an electronic design for an analysis that programmatically sweeps across multiple values of a new parameter for multiple instances in the electronic design. The analysis may be performed on the electronic design at least by adding the new parameter to the analysis engine and by sweeping the new parameter across the multiple values to generate an analysis result. The electronic design may then be updated based at least in part upon the analysis result.

In some embodiments, preparing the electronic design may include preparing a library for the electronic design at least by adding the new parameter to the library and identifying the multiple instances and a constraint that corresponds to multiple legal constraint values. In some of these embodiments, preparing the electronic design may further include generating one or more clusters for each instance of the multiple instances and generating a layout for at least the multiple instances based at least in part upon the one or more clusters.

In some of the immediately preceding embodiments for preparing the electronic design, cluster information pertaining to the one or more clusters may be back annotated to a view of the electronic design, wherein the analysis is performed on the view of the electronic design.

In some embodiments, performing the analysis may include setting the new parameter for the analysis engine based at least in part upon the multiple values of the new parameter and determining a set of parameters indicative of electromagnetic interactions among at least some of the multiple instances at least by performing a first analysis on the electronic design.

In some of these embodiments, a netlist may be generated for the electronic design based at least in part upon the set of parameters; and the analysis on the electronic design using at least the netlist.

For generating the one or more clusters, an instance may be identified from the multiple instances, and a boundary may be determined for a cluster that encapsulates the instance in some embodiments. In some of these embodiments, the cluster may be generated to encapsulate the instance; a top cluster may be generated; and the cluster may be installed into the top cluster.

For generating the layout, the new parameter and one or more device parameters may be specified for the multiple instances; and the multiple instances may be placed into corresponding clusters of the one or more clusters based at least in part upon the new parameter that has been specified to a layout generation module in some embodiments.

In some embodiments for performing the analysis on the electronic design using at least the netlist, the new parameter may be set for the analysis engine based at least in part upon the multiple values of the new parameter. In some of these embodiments, a set of parameters may be determined at least by performing an electromagnetic analysis on the electronic design with the new parameter and the multiple values.

In addition or in the alternative, the netlist may be generated for the electronic design at least by importing the set of parameters into an original netlist; and the analysis may be performed on the electronic design using at least the netlist in some embodiments.

Some embodiments are directed at a hardware system that may be invoked to perform any of the methods, processes, or sub-processes disclosed herein. The hardware system may include at least one microprocessor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

Additional and other objects, features, and advantages of the disclosure are described in the Detail Description, figures, and claims.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present disclosures briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
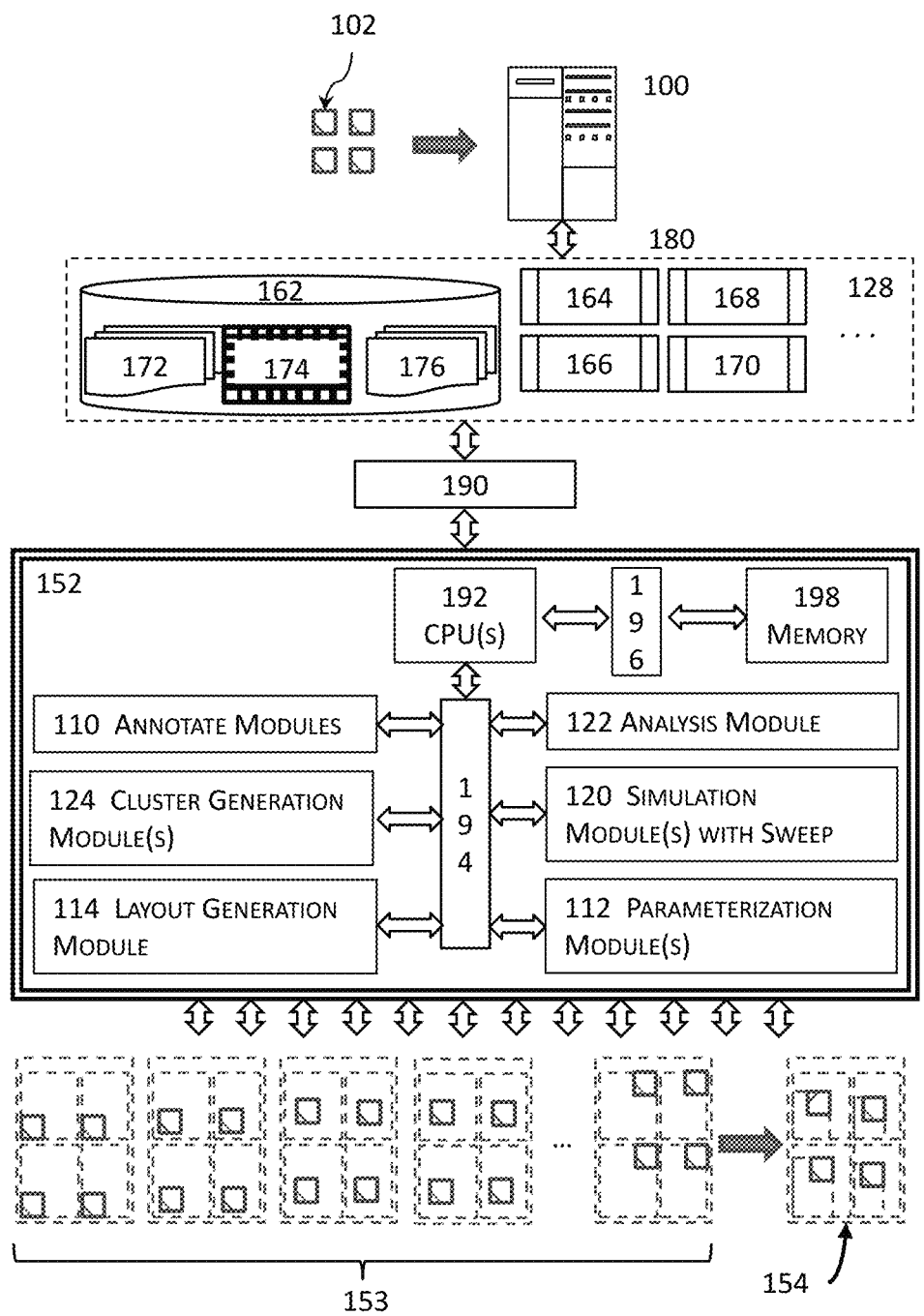
FIG. 1 illustrates a high-level block diagram of a simplified system for characterizing an electronic design with real-time modeling in one or more embodiments.

Various embodiments will now be described in detail with reference to the drawings, which are provided as illustrative examples of the invention so as to enable those skilled in the art to practice the invention. Notably, the figures and the examples below are not meant to limit the scope of the present disclosure. Where certain elements of the present disclosure may be partially or fully implemented using known components (or methods or processes), only those portions of such known components (or methods or processes) that are necessary for an understanding of the present disclosure will be described, and the detailed descriptions of other portions of such known components (or methods or processes) will be omitted so as not to obscure the invention. Further, various embodiments encompass present and future known equivalents to the components referred to herein by way of illustration.

Further, various embodiments encompass present and future known equivalents to the components referred to herein by way of illustration. It shall be noted that various features and techniques are described hereinafter in terms of embodiments and/or examples. Unless otherwise explicitly described as mutually exclusive, any embodiment, example, feature, and/or characteristic described herein may be readily combined in any suitable manner with any other embodiment, example, feature, and/or characteristic, without departing from the scope or spirit of the present disclosures. All such modifications are intended to be within the scope of claims associated with this disclosure.

In the following description, certain specific details are set forth in order to provide a thorough understanding of various disclosed embodiments. However, one skilled in the relevant art will recognize that embodiments may be practiced without one or more of these specific details, or with other methods, components, etc. In other instances, well-known structures associated with computing systems have not been shown or described in detail to avoid unnecessarily obscuring descriptions of the embodiments.

In addition, unless the context requires otherwise, throughout the specification and claims which follow, the word "comprise" and variations thereof, such as, "comprises" and "comprising" are to be construed in an open, inclusive sense that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

It shall be noted that although some examples or embodiments are described herein with reference to connect module, the same techniques may also be provided to other types of objects in an electronic design. Thus, the reference to connect module or connect modules is merely described herein as non-limiting examples.

FIG. 1 illustrates a high-level block diagram of a simplified system for characterizing an electronic design with real-time modeling in one or more embodiments. More specifically, the computing system 100 in FIG. 1 may comprise one or more physical computing systems or virtual machines 100, such as a general-purpose computer described in the System Architecture Overview section to implement one or more special proposes. The illustrative system in FIG. 1 may include an Internet-based computing platform providing a shared pool of configurable computer processing resources (e.g., computer networks, servers, storage, applications, services, a cloud environment, etc.) and data to other computers and devices in a ubiquitous, on-demand basis via the Internet. For example, one or more computing resources and/or modules illustrated in FIG. 1 may be located in a cloud computing platform where computing resources (e.g., storage resources, compute resources, etc.) are provided on an on-demand basis without direct active management by users in some embodiments.

In this system illustrated in FIG. 1, one or more computing systems 100 may invoke and execute various modules on at least a portion of an electronic design 102 having multiple instances (e.g., multiple parameterized cell or pcell instances) for optimization with respect to, for example, one or more constraints. Unlike device parameters that are by default or custom built into simulation engines for the simulation engines to sweep across a range of values for a device parameter during electronic design analysis or optimization, some constraints may not be captured or even represented in device models.

For example, some constraints governing intra-device and/or inter-device requirements such as legal or permissible spacing rules or requirements, parallel run length rules or requirements, orientation rules or requirements, etc. may not be even be reflected in device models that model internal and interface elements and characteristics of respective devices. For example, a foundry may impose a spacing constraint that corresponds to multiple permissible values (e.g., a range of permissible spacing values, minimum and maximum permissible values, etc.) between two immediately neighboring cells in an electronic design. As another example, a foundry may impose an orientation constraint for a device so that the device must be oriented in a permissible orientation in an electronic design. These constraints or the absence of any models to represent them may be further complicated when considering interactions (e.g., electromagnetic interactions) between or among devices. Although these inter-device and intra-device rules or requirements may not be captured or represented in device models, they need to be precisely followed in order to improve yield or even manufacturability for the manufacturing of the underlying electronic design.

The one or more computing systems 100 may invoke and execute a plurality of modules 152 that are specifically programmed and stored at least partially in memory of and functions in conjunction with at least one microprocessor (e.g., a central computing unit, a virtualized microprocessor, etc. 192) or processor core of the one or more computing systems 100 to perform various functions to enable a simulation module or engine (e.g., 120) to, for example, modify the libraries that support the implementation of electronic designs, to capture and incorporate design constraints or parameters that are not captured or represented in existing models, to generate clusters and encapsulate device instances in respective clusters, to generate a layout while accommodating the clusters as well as the aforementioned design constraints or parameters and their corresponding legal or permissible values, to annotate an abstraction of the electronic design (e.g., a schematic design) with the cluster information, to perform various analyses (e.g., electromagnetic analysis, etc.) to capture the interactions among devices, and/or to analyze an electronic design while programmatically sweeping any of such constraints across a plurality of legal or permissible values. For example, a simulation module or engine (120) may sweep across a set of legal or permissible spacing values to vary the spacing between two immediately adjacent instances to produce a corresponding version of the layout (153) and perform a simulation on the corresponding version of the layout to characterize the behaviors of the underlying electronic design in order to determine the optimized layout (154) that corresponds to multiple layout versions (153) of the layout generated by sweeping across the set of legal or permissible spacing values.

The mixed-signal electronic design 102 may be provided to one or more modules in the plurality of modules 152 which may further execute one or more tasks for implementing an electronic design using connect modules with dynamic and interactive control. For example, a simulation module or engine 120 may, either on its own or in conjunction with one or more other modules or engines, performing one or more simulations on the electronic design 102 while sweeping any of such constraints across a plurality of legal or permissible values to characterize the behaviors of the electronic design at each of the plurality of legal or permissible values for design optimization, engineering change orders, etc.

Some embodiments described herein may provide various levels of access to a connect module in the mixed-signal electronic design 102. For example, a layout generation module or engine 114 may automatically generate a layout for an electronic design while accommodating any new parameters that are introduced to capture or represent a constraint or requirement such as the aforementioned inter- and/or intra-device constraints or requirements.

Moreover, the one or more computing systems 100 may execute an annotation module (110) that annotate any pertinent information pertaining to any new parameters that are introduced to capture or represent a constraint or requirement such as the aforementioned inter- and/or intra-device constraints or requirements. The one or more computing systems 100 may also execute one or more clustering or cluster generation modules 124 that generate multiple clusters for a plurality of instances in an electronic design. A cluster generation module 124 may also generate a boundary for a cluster either by itself or in conjunction with, for example, the layout generation module 114.

The one or more computing systems 100 may execute an analysis module 122 that performs one or more analyses for an electronic design. For example, an analysis module 122 may perform an electromagnetic analysis on an electronic design to characterize the electromagnetic interactions among devices in the electronic design in terms of, for example, s-parameters (scattering parameters). The plurality of modules 152 may also include a parameterization module 112 that represent any devices, clusters, etc. as a parameterized cell or pcell for any new parameters that are introduced to capture or represent constraints that are not captured or represented in any default, built-in, or custom models of devices in an electronic design. More details about the modules in the plurality of modules 152 will be described below.

The plurality of modules 152 may further include one or more electronic design automation tools (not shown) such as a layout editor for editing a layout, a floor planning tool for generating floorplan(s) for an electronic design, a placement tool for placing circuit component designs into a layout, a routing tool for interconnecting circuit component designs placed by the placement tool or floorplanning tool, a physical verification tool (e.g., a DRC or design rule check tool, an LVS or layout versus schematic tool, an XOR or exclusive tool, an antenna check tool, an ERC or electrical rule check tool, etc.) for ensuring correct electrical and logical functionality and manufacturability, a logic synthesis tool, a clock inserting tool for clock wiring, a post-layout optimization tool for ensuring, for example, performance, noise, signal integrity, and/or yield meets the requirements, a DFM (design for manufacturability) tool to ensure manufacturability of an electronic design by, for example, inserting redundant and/or dummy via(s) and/or metal, diffusion, and/or polysilicon layer(s), an error checking tool for ensuring the mapping to logic is performed correctly, a tapeout and mask generation tool for transforming design data into mask data for photomasks, any other tools pertaining to the physical abstraction of an electronic design, or any combinations thereof. In some embodiments, these one or more electronic design automation tools may be included as one or more corresponding general computing resources in 128.

The plurality of modules 152 may include or at least function in conjunction with a microprocessor 192 (e.g., a central processing unit or CPU) via a system bus 194 to access or invoke various modules in 152 in some embodiments. In these embodiments, a single microprocessor 192 may be included in and thus shared among more than one module even when the computing system 100 includes only one microprocessor 192. A microprocessor 192 may further access some non-transitory memory 198 (e.g., random access memory or RAM) via a data bus 196 to read and/or write data during the microprocessor's execution of processes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources 128 that may comprise, for example, a floorplanner, a global routing engine, and/or a detail routing engine 164, a layout editor 166, a design rule checker 168, a verification engine 170, etc.

These various resources 128 may further include, for example, one or more other EDA (electronic design automation) modules such as a schematic tool, a placement tool, a routing tool, verification tools, post-route or post-layout optimization tools, various photolithography tools (e.g., optical proximity correction or OPC tools, phase shift mask or PSM tools, resolution enhancement technology or RET tools, etc.), etc. to prepare the electronic design.

For example, these various resources 128 may further optionally include one or more signoff modules (not shown) to perform various signoff and design closure tasks to ensure that the electronic design implemented by various techniques described herein may be successfully fabricated while maintaining various performance, cost, reliability, and manufacturability requirements.

Strictly as an example, the one or more signoff modules may individually or in conjunction with one or more other modules (e.g., one or more modules in the plurality of modules 152, etc.), power closure related tasks, and/or power analyses to ensure an electronic design meets power, performance, or any other requirements before tapeout. The one or more signoff modules may include one or more signoff parasitic extraction modules to provide silicon-accurate interconnect parasitic extraction and ensure first-pass silicon success, and one or more power signoff modules to perform various power integrity analyses, transistor-level electro-migration and IR-drop analyses, or other power and signal integrity analyses with SPICE-level accuracy or better accuracy with SPICE or SPICE-like simulations (e.g., Fast-SPICE, HSPICE, PSPICE, or any other SPICE-based or SPICE-compatible simulations) to ensure an electronic design meets or exceeds power, performance, and/or area goals in some embodiments.

The one or more signoff modules may include one or more physical verification modules (not shown) to perform various design rule checking, layout vs. schematic (LVS), electrical rule checks (ERC), etc. tasks to ensure that an electronic design meets or exceeds various spatial and other physical rules and one or more design for manufacturing (DFM) modules to address physical signoff and electrical variability optimization, correct lithography hotspots, predict silicon contours, improve yield, detect and repair timing and leakage hotspots to achieve variation- and manufacturing-aware signoff and design closure in some of these embodiments.

In addition or in the alternative, the one or more signoff modules may include one or more one or more computational lithography modules (not shown) to provide more accurate post-etch critical dimension accuracy and process windows on silicon, reticle and wafer synthesis, etc. to eliminate errors and/or reduce mask-manufacturing cycle times. One or more of these signoff modules may operate on the electronic design produced or modified with various techniques to be described in the following sections for proper signoff and design closure so that the signoff version of the electronic design may be properly manufactured with first-pass or fewer passes silicon success in some embodiments. In these embodiments, the signoff version of the electronic design produced or modified with various techniques described herein causes the underlying electronic circuit to be manufactured by a foundry or IC (integrated circuit) fabrication facility when the signoff version of the electronic design is forwarded to the foundry or IC fabrication facility that in turn fabricates the requisite photomasks and the eventual electronic circuit.

Once sign-off and/or design closure is achieved, the electronic design is finalized for tapeout; and the electronic design is transmitted to mask fabrication equipment for mask preparation and mask writing to produce photomasks that are then used in the actual manufacturing of the electronic circuits represented by the electronic design.

The one or more computing systems 100 may further write to and read from a local or remote (e.g., networked storage device(s), virtualized storage resource(s), etc.) non-transitory computer accessible storage 162 that stores thereupon data or information such as, but not limited to, one or more databases (174) such as schematic design database(s) or physical design database(s), electronic circuit design specification database(s), techfiles (or technology files) for multiple manufacturing processes for fabricating an underlying electronic design, various statistics, various data, rule decks, various design rules, constraints, etc. (172), or other pertinent information or data (176) that may be used to facilitate the performance of various functions described herein.

In some embodiments, the computing system 100 may include the various resources 128 such that these various resources may be invoked from within the computing system via a network or a computer bus 190 (e.g., an internet session, an intranet session, a data bus 196 interfacing a physical or virtual microprocessor 192 and the non-transitory computer accessible storage medium 198 (e.g., memory) or a system bus 194 between a microprocessor 192 and one or more engines or modules in the various resources 128). In some other embodiments, some or all of these various resources may be located remotely from the computing system 100 such that the computing system may access the some or all of these resources via a computer bus 190 and one or more network components.

In some embodiments, the computing system 100 may include the various resources 128 such that these various resources may be invoked from within the computing system via a system bus 194 (e.g., a data bus interfacing a microprocessor 192 and the non-transitory computer accessible storage medium 198 or a computer bus 190 between a microprocessor 192 and one or more engines in the various resources 128). In some other embodiments, some or all of these various resources may be located remotely from the computing system 100 such that a computing system 100 may access the some or all of these resources via a computer bus and/or one or more network components.

Figure 2A:
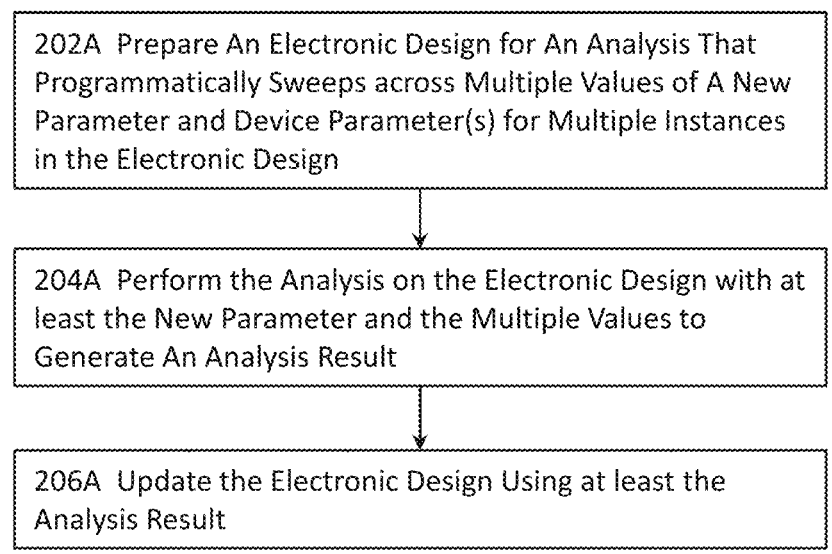
FIG. 2A illustrates a high-level flow diagram for characterizing an electronic design with real-time modeling in one or more embodiments.

FIG. 2A illustrates a high-level flow diagram for characterizing an electronic design with real-time modeling in one or more embodiments. More specifically, an electronic design of interest may be prepared at 202A for an analysis. Various techniques described herein enables the analysis to programmatically sweep across multiple values of a new parameter and one or more default, built-in, and/or custom device parameters for multiple instances in the electronic design.

A new parameter may include a parameter corresponding to a constraint that is not reflected, captured, or represented by any means in any existing default, built-in, or custom models for devices used in the electronic design. Some examples of such constraints include one or more constraints that govern intra-device and/or inter-device requirements such as legal or permissible spacing rules or requirements, parallel run length rules or requirements, orientation rules or requirements, etc. may not be even be reflected in device models that model, for example, internal and interface elements and characteristics of respective devices but do not model certain characteristics (e.g., orientation of a device in a layout) within a device or certain other characteristics (e.g., spacing, parallel run length, etc.) between the device and one or more other devices.

Various techniques described herein introduce a new parameter to represent a constraint that is not captured, reflected, or represented in existing models or designs to enable analysis modules. Some embodiments further determine a plurality of parameter values for the new parameter based at least in part upon the constraint. For example, a foundry may impose a horizontal spacing constraint (e.g., in the X-direction) that require two immediately adjacent instances be spaced apart between a minimum spacing value and a maximum spacing value. Some embodiments programmatically determine More details about preparing an electronic design at 202A will be described below with reference to FIG. 2B.

In some embodiments, a new Component Description Format parameter may be added by using the following example function:

_rtmCompleteCell(srcLibName srcCellName srcViewName destLibName)

Once the electronic design preparation is complete, the analysis may be performed at 204A on the electronic design with at least the new parameter and the multiple values thereof to generate an analysis result. In some embodiments, the analysis may be performed by a simulation engine or module (e.g., 120 in FIG. 1) that programmatically sweeps across a plurality of legal or permissible values that are derived from the constraint during an analysis to determine an optimal design configuration pertaining to the multiple instances based at least in part upon the plurality of legal or permissible parameter values. With the analysis determined at 204A, the electronic design may be updated at 206A based at least in part upon the analysis result.

Figure 2B:
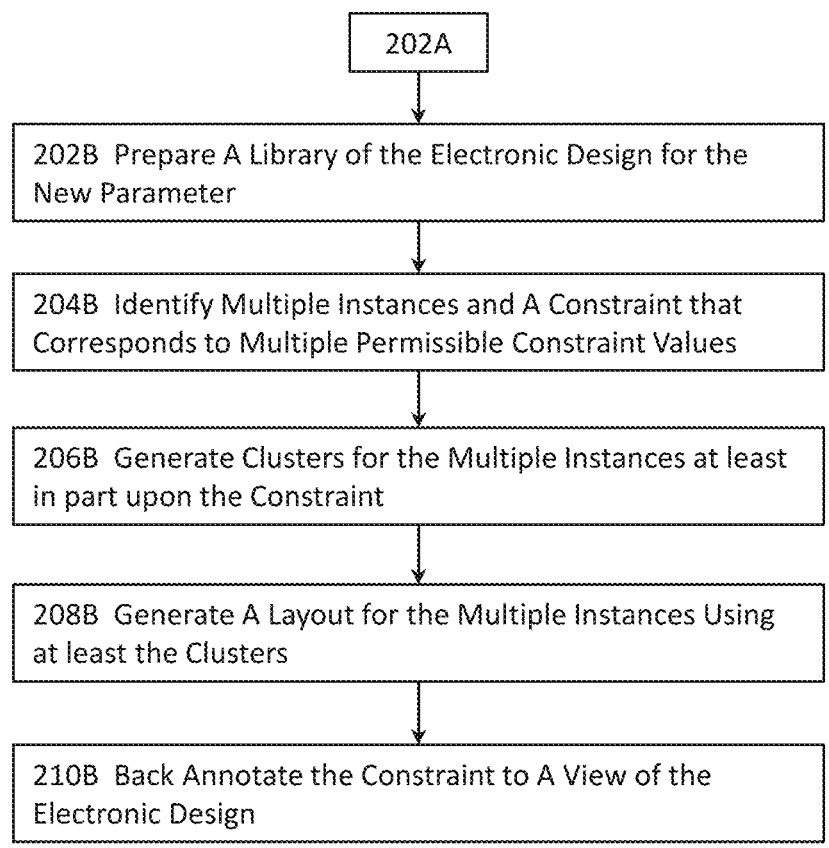
FIG. 2B illustrates more details about a portion of the high-level flow diagram illustrated in FIG. 2A in one or more embodiments.

FIG. 2B illustrates more details about a portion of the high-level flow diagram illustrated in FIG. 2A in one or more embodiments. More specifically, FIG. 2B illustrates more details about preparing an electronic design at 202A in some embodiments illustrated in FIG. 2A. In these embodiments, a library that is referenced during the implementation and/or analysis of the electronic design or the multiple instances in the electronic design may be prepared at least by introducing or adding the new parameter to the library. For example, one or more new parameters for placing an instance within a spacing constraint or an orientation constraint (e.g., constraints imposed by a foundry) in a layout may include a X-location parameter (e.g., _rtmXLoc where "rtm" denotes "real-time modeling" to indicate the dynamic nature of the parameter), a Y-location parameter (e.g., _rtmYLoc), and/or an orientation parameter (e.g., _rtmOri), etc.

In some embodiments, the new parameter may be introduced as a CDF (Component Description Format) parameter or a parameter of other equivalent formats. Component Description Format describes parameters and/or attributes of parameters of individual components and libraries of components and permits users to create and describe user's own, custom components. A CDF description (or other equivalent formats) may assign parameters and parameter attributes to one or more electronic design automation libraries and cells. For example, the CDF platform may assign a parameter name and value, check whether the value lies within one or more specified ranges, allocate a default value for a parameter, and/or dynamically change how a parameter is displayed based at least in part upon a condition, etc. In some embodiments, a new parameter is independent of the software applications and design views (e.g., cellviews) and may thus be shared and reused in different software applications and views. It shall be noted that although the aforementioned examples refer to the Component Description Format, other equivalent formats or tools may also be used and are thus contemplated to prepare a library for electronic design automation in order to accommodate such constraints that are not captured or reflected in existing models or libraries.

At 204B, a constraint that corresponds to multiple legal or permissible values may also be identified at 204B. In addition, multiple instances subject to the constraint may be identified at 204B from the electronic design. These four instances may correspond to an identical device or circuit component in some embodiments or may correspond to two or more different devices or circuit components in some other embodiments. The constraint includes one that is not explicitly or implicitly captured, reflected, or represented by any means in any existing libraries or models for devices or circuit components in some embodiments.

For example, a foundry may impose an orientation constraint that permits a device to be placed in a layout in one or more legal or permissible orientations (e.g., R0 for no rotate, R90 for rotation by 90 degrees, R180 for rotation by 180 degrees, R270 for rotation by 270 degrees, etc.). As another example, a foundry may impose a spacing constraint between two or more instances in a layout, and the spacing constraint may permit a range of spacing values, a set of discrete spacing values, or the minimum and the maximum spacing values between which a placement of two neighboring instances is considered legal. At 204B, some embodiments identify a constraint and multiple legal or permissible values for the constraint.

A plurality of clusters may be generated at 206B for the multiple instances identified at 204B. In some embodiments, a software application (e.g., a cluster generation module 124) may programmatically function with memory and at least one processor or processor core of a computing node to generate a cluster for each instance of the multiple instances. In addition or in the alternative, the software application may programmatically generate a top cluster that encompasses the cluster for each instance of the multiple instances. In some embodiments, the top cluster may be correlated with the constraint identified at 204B and may be referenced in subsequent processes (e.g., an analysis process, a simulation process, etc.) to represent the constraint that applies to the multiple instances. It shall be noted that the term "top" does not explicitly or implied the top cluster's hierarchical position or level in the electronic design. Rather, the generation of clusters and the top cluster does not alter the hierarchical structure of the electronic design or the multiple instances for which these clusters are generated.

A cluster is thus associated with one or more instances and may be stored as a software object (e.g., a software object in the context of object-oriented programming). For example, a cluster may be stored as a parameterized cell or pcell that is correlated with the instance (or instances in the case of the top cluster). More details about 204B are described below with reference to FIG. 3A.

A layout may be generated at 208B for the multiple instances using at least the clusters generated at 206B based at least in part upon the constraint or the multiple values corresponding to the constraint. For example, each instance may be installed into its corresponding cluster, and the multiple clusters for the multiple instances may be incorporated into the top cluster. More details about generating a layout at 208B are described below with reference to FIG. 3B. In some embodiments, information pertaining to one or more clusters may be back annotated to a view at one or more other abstractions (e.g., a schematic view, a simulation view, etc.) of the electronic design at 210B.

Figure 2C:
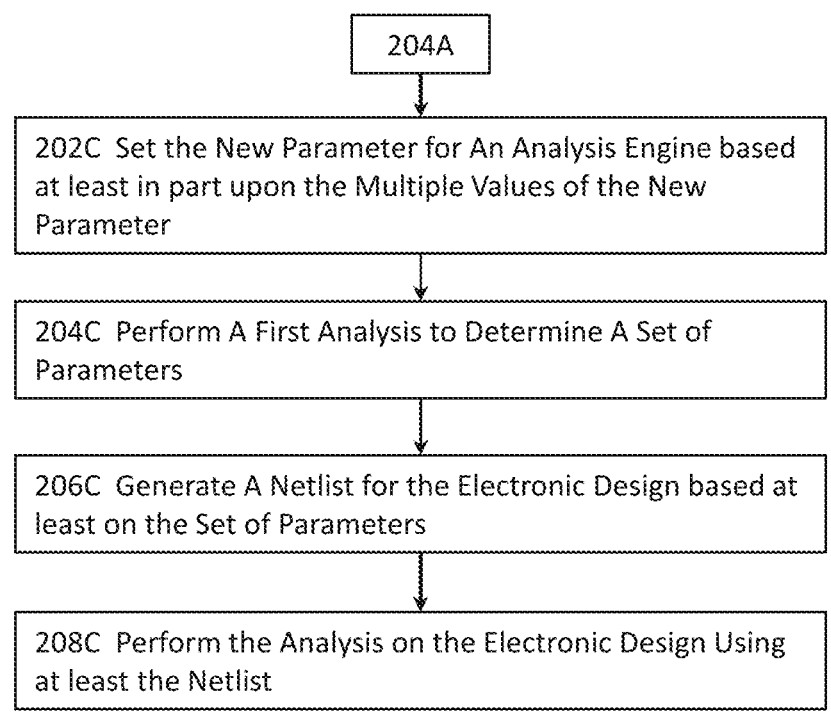
FIG. 2C illustrates more details about another portion of the high-level flow diagram illustrated in FIG. 2A in one or more embodiments.

FIG. 2C illustrates more details about another portion of the high-level flow diagram illustrated in FIG. 2A in one or more embodiments. More specifically, FIG. 2C illustrates more details about performing an analysis on the electronic design at 204A of FIG. 2A. In these embodiments illustrated in FIG. 2C, a new parameter that is introduced to capture or represent a constraint or requirement may be set at 202C for an analysis engine based at least in part upon constraint, the legal or permissible values corresponding to the constraint, or the multiple values of the new parameter that are derived from the constraint or its multiple legal or permissible values.

To characterize the electromagnetic interactions among devices or circuit components in the electronic design, a first analysis may be performed at 204C to determine a set of parameters pertaining to the devices or circuit components. In some embodiments, the devices or circuit components include the multiple instances identified at, for example, 204B. For example, an electromagnetic analysis may be performed at 204C to determine a set of s-parameters (scattering parameters) in some embodiments. In these embodiments, the process creates a schematic for which the s-parameters data will be represented. An electromagnetic analysis may be added and pointed to the schematic. The frequency range and other inputs such as the step size may be set for the electromagnetic analysis for a desired resolution of the s-parameter data. The electromagnetic analysis may be performed to generate the analysis data as, for example, a s-parameter file.

A netlist may then be generated at 206C by first instantiating the generated s-parameters or by importing the s-parameter from, for example, the s-parameter file or a library. For example, one or more instances may be selected, and the library for these one or more identified instances may be directed to the s-parameters (e.g., the s-parameter file, a library having the s-parameter data, etc.), and the one or more identified instances may be placed in the electronic design.

The analysis (e.g., a simulation) may be performed on the electronic design at 208C while accounting for the new parameter and the multiple legal, permissible values therefor as well as the s-parameters that characterize the electromagnetic interactions. For example, the s-parameters or data from the s-parameter file may be placed at the respective ports in the electronic design (e.g., a schematic of the electronic design that is back annotated with the cluster information for the multiple instances).

An analysis tool (e.g., a simulation engine or module 120 in FIG. 1) that performs the analysis thus not only accommodates the electromagnetic interactions among devices and components but also the constraint that permits the multiple instances to be placed in a layout with multiple legal, permissible values. Moreover, due to the introduction of the new parameter, the analysis tool may programmatically sweep the parameter across multiple parameter values that are determined based at least in part upon the multiple legal, permissible values of the constraint.

In an example where a foundry imposes a spacing constraint between neighboring instances, a designer may declare or set the minimum and the maximum legal or permissible spacing values in the analysis tool and determine a step size between the minimum and the maximum spacing values (or a total number of steps therebetween). The analysis tool may thus programmatically, automatically sweep across these multiple steps. At each step, the layout tool programmatically, automatically, without user intervention, alters the respective locations of the multiple instances.

For example, the layout tool may first place an instance at the origin of its corresponding cluster and alters the location of the instance relative to the cluster by incrementally varying the X-location parameter at each step or by offsetting the instance from the origin based on the X-location parameter at each step of the total number of steps for sweeping the X-location parameter across its legal or permissible values. Because each step is configured to vary within the permissible spacing values, the layout thus generated thus satisfies the constraint imposed by the foundry. Electromagnetic interactions among devices or circuit components in the layout may then be characterized in terms of s-parameters which may then be imported to a simulation view that has been back annotated with information pertaining to the clusters of multiple instances. A simulation may thus be performed (e.g., at 208C) on the simulation view. Various techniques described herein thus enable an analysis tool to programmatically, automatically sweep across multiple values of a new parameter that corresponds to a constraint.

Figure 3A:
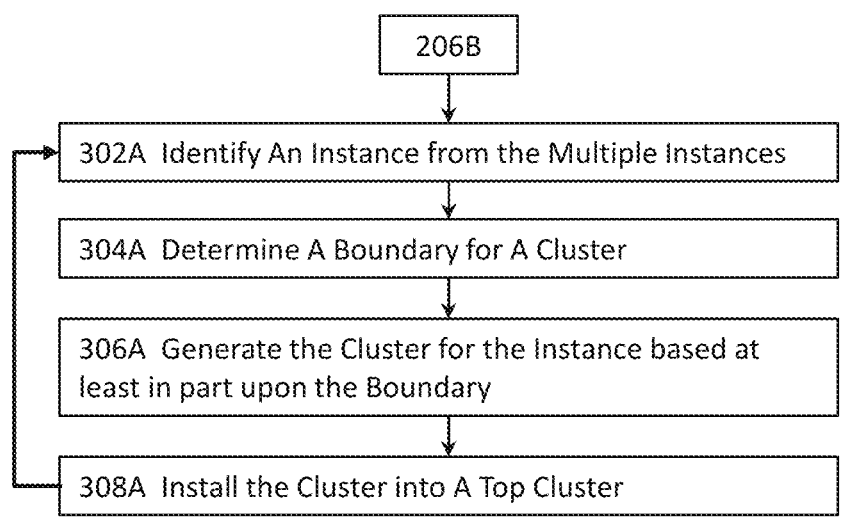
FIG. 3A illustrates more details about a portion of the high-level flow diagram illustrated in FIG. 2B in one or more embodiments.

FIG. 3A illustrates more details about a portion of the high-level flow diagram illustrated in FIG. 2B in one or more embodiments. More specifically, FIG. 3C illustrates more details about generating clusters for the multiple instances at 206B in FIG. 2B. In these embodiments illustrated in FIG. 3A, an instance may be identified at 302A from the multiple instances identified at, for example, 204B. For the instance identified at 302A, a boundary may be determined at 304A, and a cluster may be generated at 306A for the instance. It shall be noted that although FIG. 3A illustrates an arrowhead pointing from 304A to 306A, the order between 304A and 306A may changed in some embodiments. That is, a cluster may be generated before determining a boundary for the cluster or for the cluster in some embodiments or after determine the boundary for the cluster in some other embodiments.

A cluster may be generated to fully enclose the instance for which the cluster is to be generated. Therefore, the smallest cluster for an instance assumes the boundary of the instance. In order to accommodate a constraint that allows the placement of an instance with respect to a neighboring instance, a cluster is usually generated in such a way to allow the instance to move in one or more directions within the cluster. In some embodiments, a cluster may be generated based not only upon the size of the instance but also the constraint or the legal or permissible values corresponding to the constraint.

Because an instance may be freely moved within a cluster, two immediately neighboring clusters may be generated and placed with the minimum spacing value between the two clusters in a layout in some embodiments so that the minimum spacing value may be maintained when the two corresponding instances are coincident with the respective opposing edges or boundaries of the two clusters. In some other embodiments where two neighboring clusters may overlap with each other, the two corresponding instances may thus not freely move within the cluster. Rather, the legal or permissible locations of one or both instances may be further restricted to compensated for the overlapping distance.

A boundary may be generated by accounting for the size of the instance for which a cluster is generated or to be generated as well as a constraint that governs where the instance may be placed within the layout. A boundary is associated with a cluster, and the boundary may thus be determined in a substantially similar manner as that described immediately above for the cluster. For example, a boundary of a cluster may be generated not only by accounting for the size of the instance for which the boundary for a cluster is generated but also a constraint that limits the legal or permissible placement locations of the instance in a layout so that the constraint is complied with when the instance freely moves within the boundary of a cluster during the sweeping of a new parameter for the constraint across multiple values in an analysis.

In some embodiments where a boundary is first determined at 304A, a subsequently generated cluster may be based at least in part upon the boundary, and the cluster may be associate with the boundary to provide confines for the placement options of the instance within the cluster during sweeping of the new parameter. A boundary may be generated programmatically by, for example, a cluster generation module 124 and/or the layout generation module 114 in FIG. 1 in some embodiments. In some other embodiments, a boundary may be custom and manually generated by a user by, for example, manually specifying the boundary (e.g., by specifying the vertices, by drawing the boundary in a graphical user interface, etc.) In the latter embodiments where a user manually specifies a boundary for an instance, various techniques described herein may check the validity or legality of the boundary and adjust the boundary, if necessary, to comply with one or more constraints or requirements.

In addition to generating a cluster for each instance of the multiple instances as described above, a top cluster may also be generated at 306A in some embodiments. The top cluster may be generated to encapsulate or enclose the multiple, individual clusters respectively generated for individual instances. The top cluster may be optionally associated with a boundary in some embodiments or without any boundaries in some other embodiments where instances move within their respective clusters that remain stationary. The top cluster encapsulating multiple individual clusters may be a logical construct and may be stored as a software object in the context of object-oriented programming.

The individual clusters may then be installed into the top cluster at 308A to complete the encapsulation. In some embodiments, information pertaining to the clusters (e.g., individual clusters and/or the top clusters) as well as information pertaining to specific steps of the sweeping or parameter values may be back annotated to a simulation view (e.g., a schematic view) so that the simulation view is made aware of the configuration (e.g., information pertaining to some placement details of instances in their respective clusters or information pertaining to the top cluster at a specific step during the sweep) of the layout due to the sweep of multiple legal or permissible values in the layout.

A cluster is thus associated with one or more instances (e.g., one instance for a cluster generated for an individual instance, and multiple instances that encapsulates multiple individual instances) and may be stored as a software object (e.g., a software object in the context of object-oriented programming). For example, a cluster may be stored as a parameterized cell or pcell that is correlated with the instance (or instances in the case of the top cluster).

In the aforementioned example where a constraint imposes a plurality of legal or permissible spacing values or the minimum and the maximum spacing values, a cluster generated for an individual instance may be parametrized to comprise an origin, a local coordinate system, a X-location parameter indicating how much the instance is to be offset from the origin along the X-axis, a Y-location parameter indicating how much the instance is to be offset from the origin along the Y-axis, or an orientation parameter indicating how much the instance rotates with respect to the X- and/or Y-axis, etc. With one or more of these parameters and information, an instance for which the cluster is generated may be installed into the cluster. Moreover, an analysis engine may programmatically sweep across multiple parameter values (e.g., X-Location parameter values, Y-Location parameter values, orientation values, etc.) to alter the placement of the instance during analyses, without user intervention, to determine an optimized or improved layout based on the analysis results of the electronic design at each of the multiple parameter values.

A cluster may thus be generated for each of the multiple instances identified at, for example, 204B. In some embodiments, the process determines whether there is a remaining instance for which a cluster has not been created. If the determination is affirmative, the process returns to 302A and repeats 302A through 308A. Otherwise, the process in FIG. 3A terminates and returns to 208B in FIG. 2B.

Figure 3B:
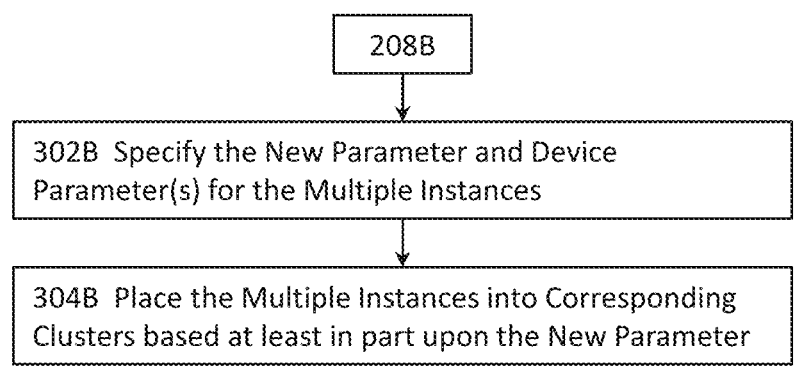
FIG. 3B illustrates more details about another portion of FIG. 2B for characterizing an electronic design with real-time modeling in one or more embodiments.
Figure 3C:
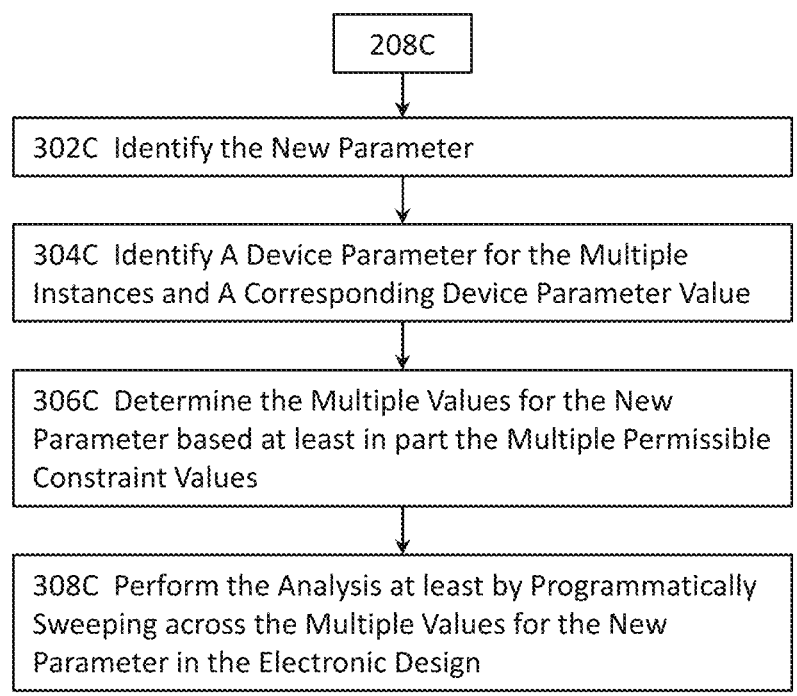
FIG. 3C illustrates more details about a portion of FIG. 2C for characterizing an electronic design with real-time modeling in one or more embodiments.

FIG. 3B illustrates more details about another portion of FIG. 2B for characterizing an electronic design with real-time modeling in one or more embodiments. More specifically, FIG. 3B illustrates more details about generating a layout at 208B in FIG. 2B. In these embodiments, the new parameter and one or more device parameters, if available, may be specified at 302B for the multiple instances identified at 204B. Generating a layout at 302B may include placing an instance within its cluster in the layout, determining or identifying a cluster boundary for the cluster, associates the cluster with the instance, and instantiate the cluster and the instance in the layout. In some embodiments, generating a layout may be implemented with the following example code/pseudodcode:

rtmGenerateConstraintLayout(axlSession ciConstraintName variables @optional (layViewName "layout") (openLayoutView nil))

It shall be noted that the above example layout generation function may be used to accommodate new parameters pertaining to a spacing constraint and/or an orientation constraint. In addition to new parameters corresponding to constraints not captured or reflected in libraries or circuit component models, this example function also handles device parameters in exactly the same manner as layout editors or engines.

The multiple instances may be respectively placed into their corresponding clusters at 304B based at least in part upon the new parameter. Due to the introduction of a new parameter that corresponds to a constraint and multiple legal or permissible values thereof, placing an instance into its cluster may be invoked by an analysis engine that programmatically sweeps the new parameter across a plurality of parameter values. For example, the analysis engine may place an instance at a first position (and/or orientation) relative to its cluster (e.g., relative to the local origin of the cluster) and invokes a layout generation module to generate a layout with the instance at the first position. The analysis engine may then perform, for example, an electromagnetic analysis to determine a set of s-parameters to capture the interactions among devices or circuit components. The s-parameters may be imported into a simulation view, and a simulation engine or the analysis engine may perform a simulation on the simulation view with the s-parameters. The analysis engine may then set the instance to a second position (and/or orientation) and repeats the aforementioned processes to characterize the electronic design with the instance at the second position (and/or orientation). In this manner, the analysis engine or simulation engine is enabled to programmatically sweep across a plurality of values of a new parameter that has not be captured, reflected, or represented in any libraries or device models, without user intervention.

FIG. 3C illustrates more details about a portion of FIG. 2C for characterizing an electronic design with real-time modeling in one or more embodiments. More specifically, FIG. 3C illustrates more details about performing an analysis on the electronic design at 208C in FIG. 2C. In these embodiments illustrated in FIG. 3C, the new parameter may be identified at 302C. As described above, a new parameter corresponds to a constraint that allows a circuit component to have different characteristics (e.g., different legal positions, different orientations, etc.) in an electronic design, yet the constraint or its permissible or legal values are not captured, reflected, represented, or parameterized in a design libraries or circuit component models to allow any software applications to programmatically sweep across such different characteristics. Conventionally, a user must manually configure a software application by, for example, manually specifying a set or range of values for such characteristics. Various techniques described herein enable a software application to programmatically capture such a constraint, create one or more new parameters (e.g., one or more CDF parameters, etc.) to represent the constraint, determine a plurality of values for a new parameter, and sweep across the plurality of values.

In addition to accommodating new parameters as described above, some embodiments may also provide the same functionality for device parameters. A device parameter may thus be identified at 304C for an instance of the multiple instances. A plurality of device parameter values may also be identified at 304C for the identified device parameter. An analysis or simulation engine described herein may also programmatically sweep across the plurality of device parameter values for a device parameter as well as a separate plurality of values for a new parameter.

Multiple values for the new parameter may be determined at 306C based at least in part upon the multiple permissible or legal constraint values. In an example where a constraint imposes the maximum spacing value and the minimum spacing value between two immediately neighboring instances, the multiple values may be programmatically determined by, for example, identifying a set of discrete values between the minimum and the maximum spacing values, determining a total number of steps for sweeping from the minimum spacing value to the maximum spacing value, determining a step size for sweeping from the minimum spacing value to the maximum spacing value, etc. In some embodiments, a default number of steps, a default step size, and a programmatically determined set of discrete values may be used at 306C where the default number of steps, the default step size, or the programmatically determined set of discrete values may be overridden by a user.

With the multiple values determined for the new parameter at 306C, the analysis may be performed at 308C where an analysis engine programmatically sweeps across the multiple values for the new parameter and performs the analysis for each of the multiple values in a process to, for example, optimize the electronic design with respect to the new parameter (or the constraint to which the new parameter corresponds). Moreover, as the analysis engine sweeps across the multiple values for the new parameter, a layout generation module may be programmatically invoked by, for example, an inter-process call to automatically generate a layout with a specific value for the new parameter.

An analysis module may then perform, for example, an electromagnetic simulation to capture the electromagnetic interactions among devices or circuit components in terms of s-parameters that may be further imported to a simulation view upon which a simulation may be performed to characterize the behaviors of the underlying electronic design. As the analysis engine completes the sweep of the multiple values for the new parameters, an optimized electronic design may be determined based at least in part upon the characterized behaviors at each of the multiple values. With these techniques described herein, the electronic design may be implemented, and its behaviors may be programmatically, automatically characterized in real-time or nearly real-time for any constraints or requirements that are not otherwise captured, reflected, represented, or parameterized while accommodating electromagnetic interactions. Moreover, all of the aforementioned processes or subprocesses may be performed completely without human intervention, unless a user chooses to intervene (e.g., by overriding a default value).

Figure 4A:
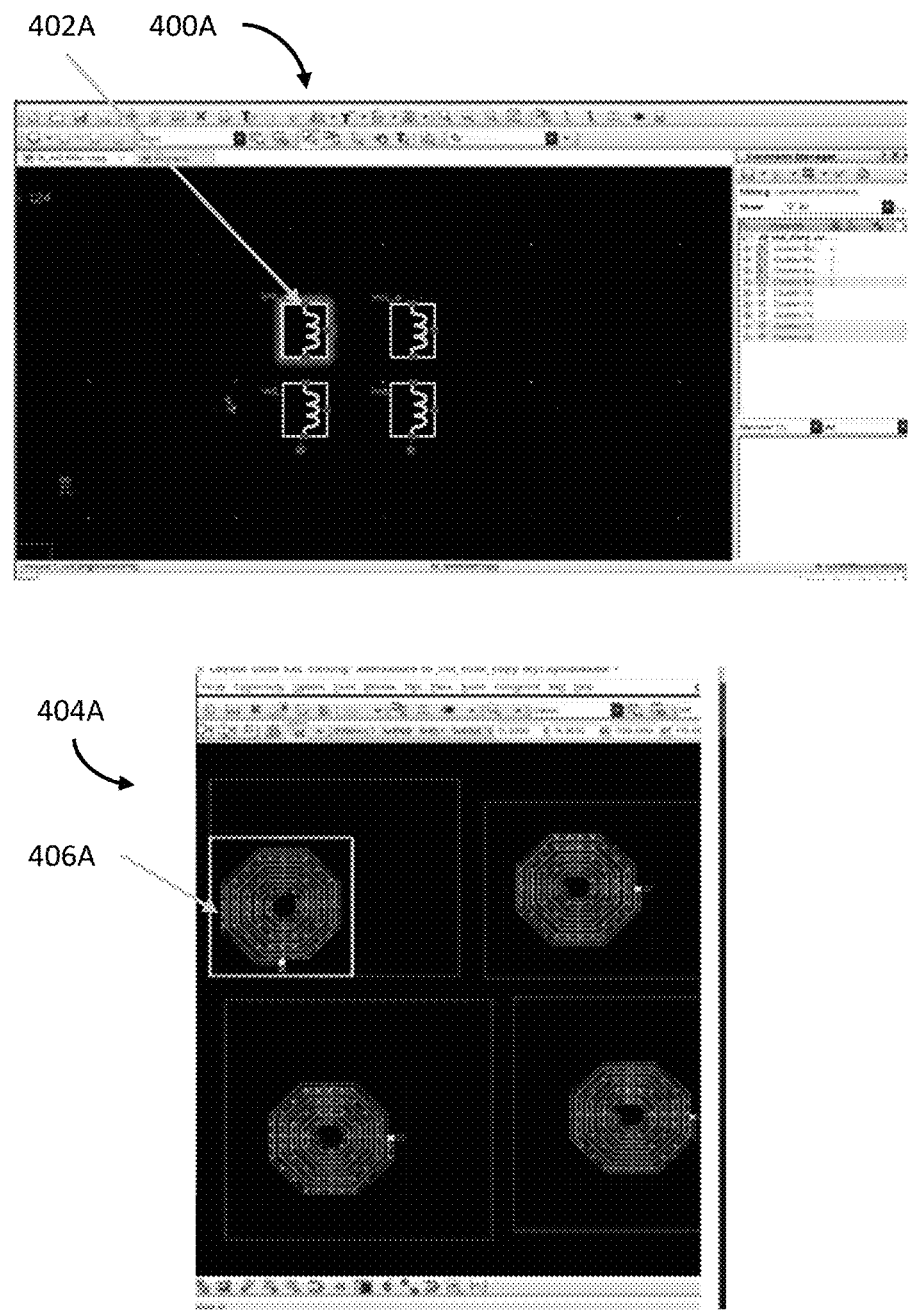
FIGS. 4A-4M illustrate some examples of characterizing an electronic design with real-time modeling in one or more embodiments.

FIGS. 4A-4N illustrate some examples of characterizing an electronic design with real-time modeling in one or more embodiments. FIG. 4A illustrates a schematic view 400A having four instances of inductors 402A. FIG. 4A further illustrates the corresponding layout view 404A showing four instances of inductors 406A.

Figure 4B:
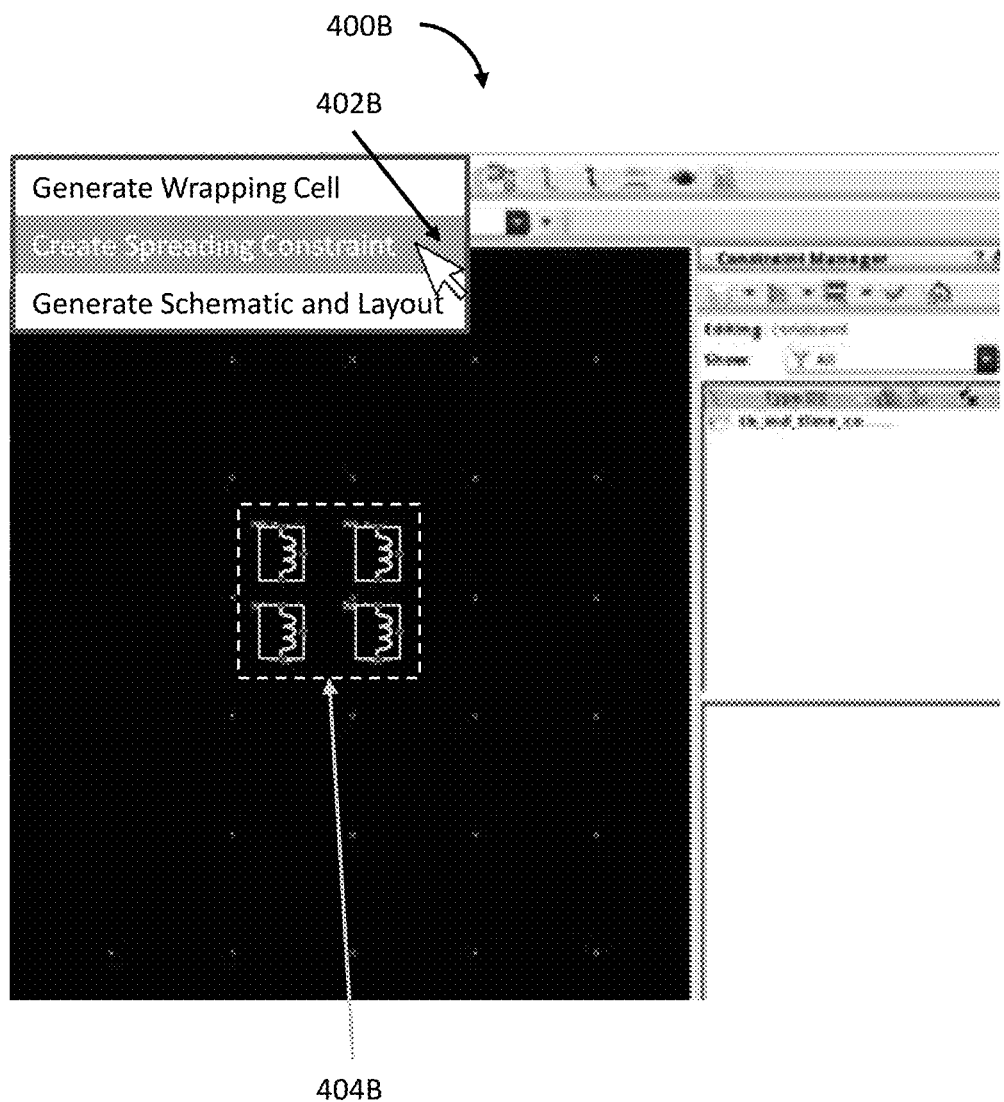

FIG. 4B illustrates a portion of an example user interface 400B that provides a menu command "Create Spreading Constraint" 402B. The menu command 402B may be used to create a spreading constraint for selected instances 404B so that the corresponding instances for the selected instances 404B in the layout may be placed in such a way to maintain, for example, a spacing constraint imposed by a foundry. It shall be noted that although the user interface 400B in FIG. 4B appears to displaying a schematic of a portion of an electronic design, the same menu command to create a constraint may also be implemented in the user interface of other abstractions (e.g., a layout tool). Moreover, the constraint created via the menu command 402B corresponds to a constraint that not been captured, represented, reflected, or otherwise parameterized in libraries or circuit component models. For example, menu command 402B may be invoked to create a constraint that corresponds to a spacing constraint, an orientation constraint, an abutment constraint, etc. imposed by a foundry on neighboring devices in an electronic design.

Figure 4C:
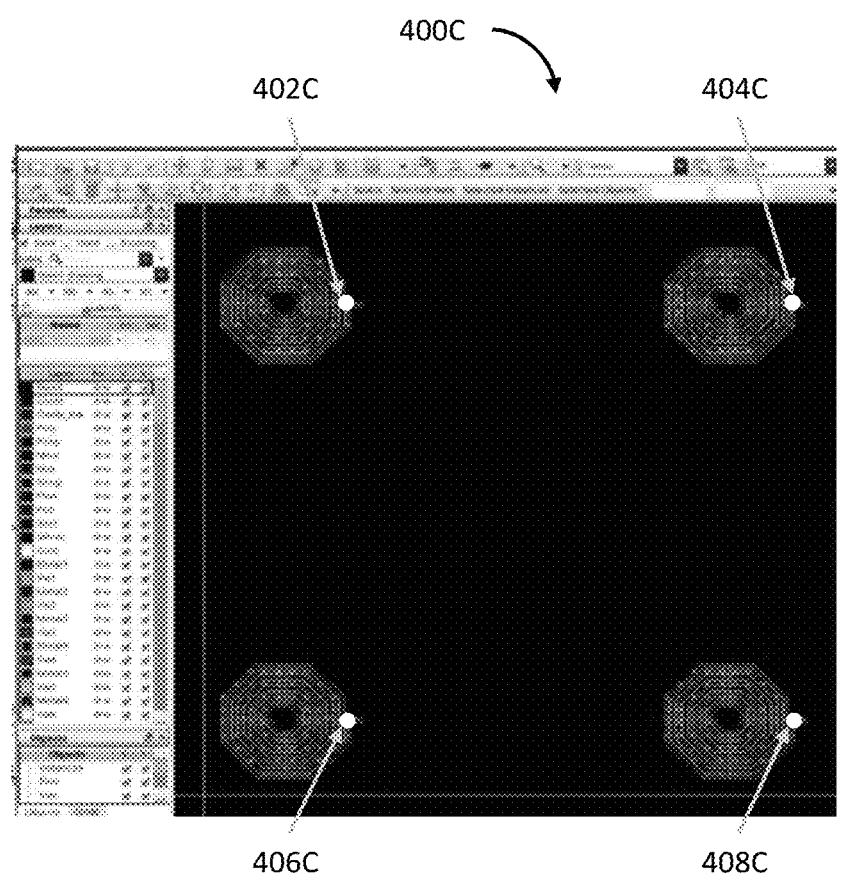

FIG. 4C illustrates an example of orienting the four inductor instances in a layout window 400C. As illustrated in FIG. 4C, all four instances are oriented in the same orientation as indicated by the locations of the respective dots 402C, 404C, 406C, and 408C. As described above, a foundry may impose an orientation constraint that prescribes one or more legal or permissible orientations (e.g., R0, R90, R180, R270, etc.) for instances subject to the orientation constraint.

Figure 4D:
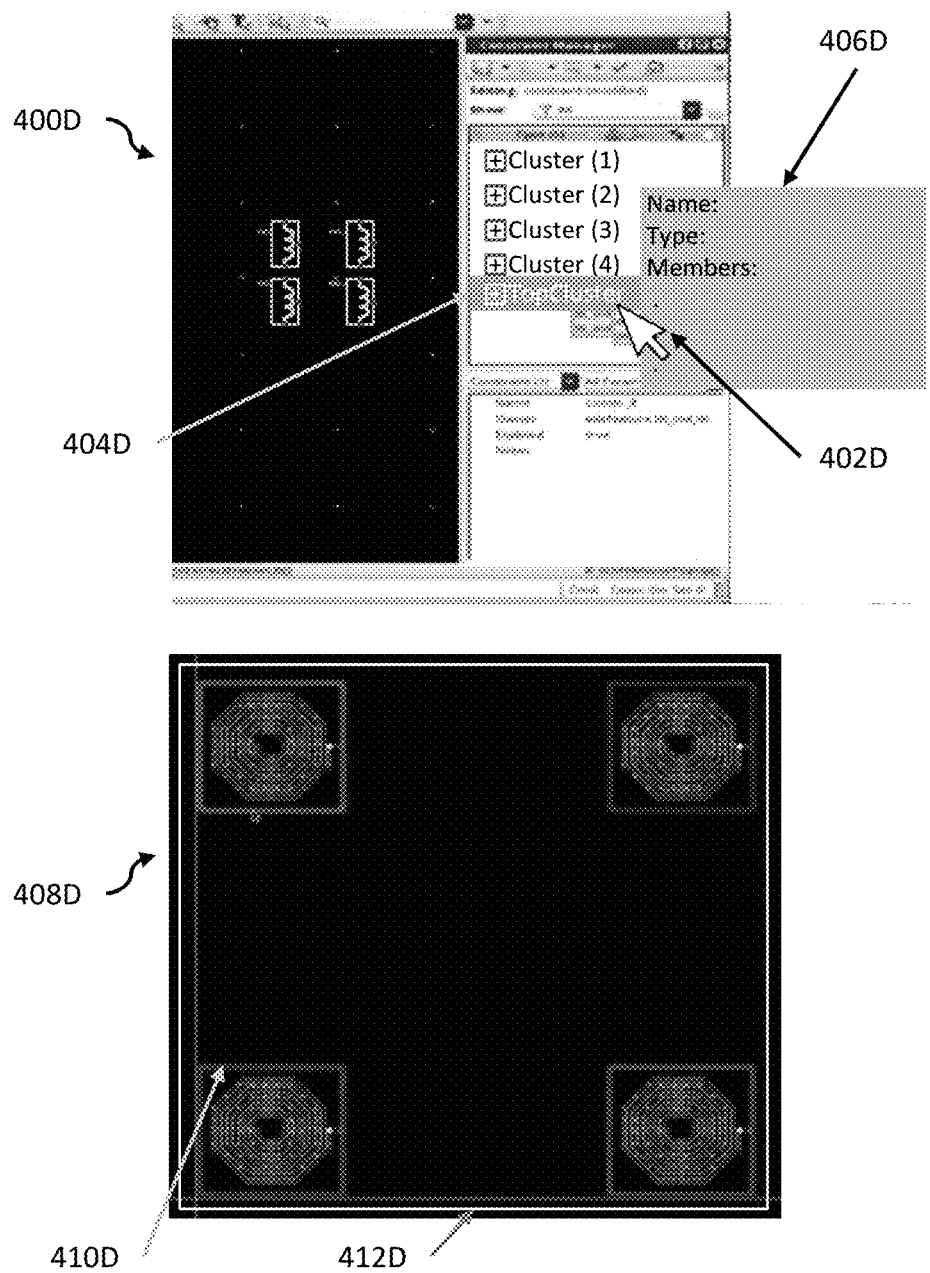

FIG. 4D illustrates an example of a cluster 410D for each of a plurality of instances as well as a top cluster 412D in the layout window 408D. Moreover, FIG. 4D illustrates an example result of back annotating information about the individual clusters (e.g., 410D) and the top cluster (412D) into a schematic view 400D. The schematic view 400D illustrated the back-annotated information 404D pertaining to the individual clusters (e.g., 410D) and the top cluster (412D). For the ease of illustration and description, the back-annotated information may include the name or identifier of each cluster as well as that of the top cluster in this example (e.g., "Cluster (1)," "Cluster (2)," "Cluster (3)," "Cluster (4)," and "TopCluster") to indicate that certain clusters have been created. Furthermore, each individual piece of the back-annotated information in 404D may be expanded and collapsed. Moreover, a context window 406D may be displayed to show more details (e.g., name of the cluster, a type of the encapsulated device, member circuit components in the cluster, or any other suitable information, etc.) about a specific piece of back-annotated information in 404D by, for example, hovering a pointing device pointer 402D over the specific piece of back-annotated information in 404D.

Figure 4E:
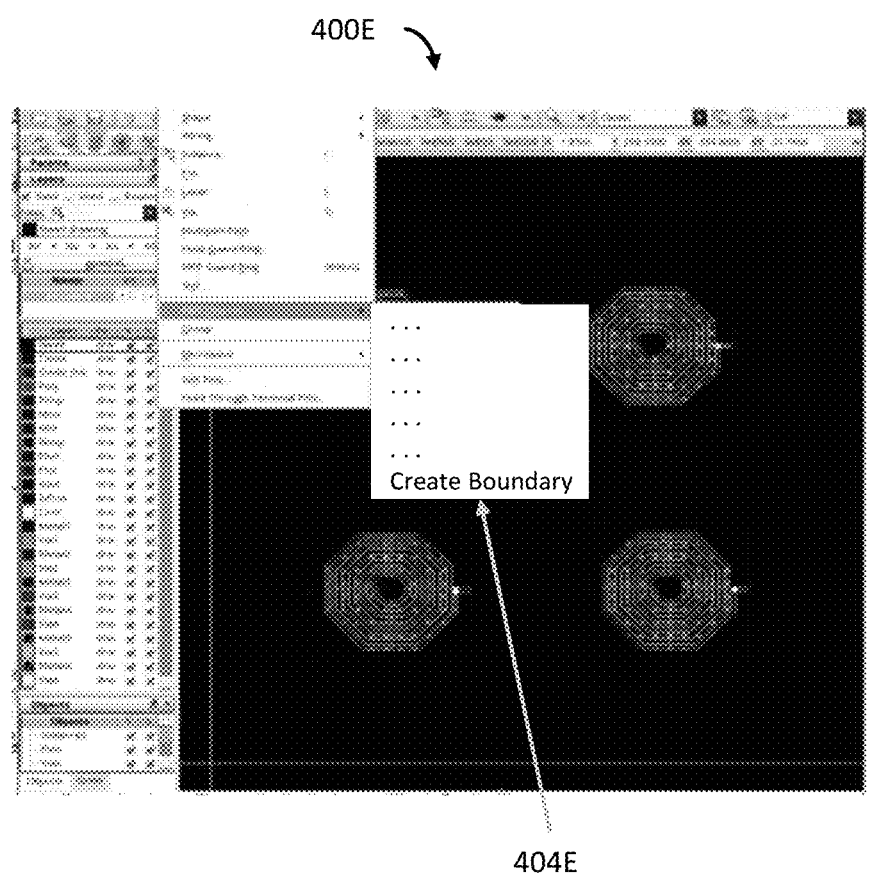

FIG. 4E illustrates an example where a layout window user interface 400E may provide a command "Create Boundary" 400E for an instance or a cluster in the layout window user interface 400E. This "Create Boundary" command 400E, when invoked for a selected instance or cluster, may call function or module to determine and create a boundary for an instance or a cluster of an instance by using the techniques described above with reference to, for example, FIG. 3A.

Figure 4F:
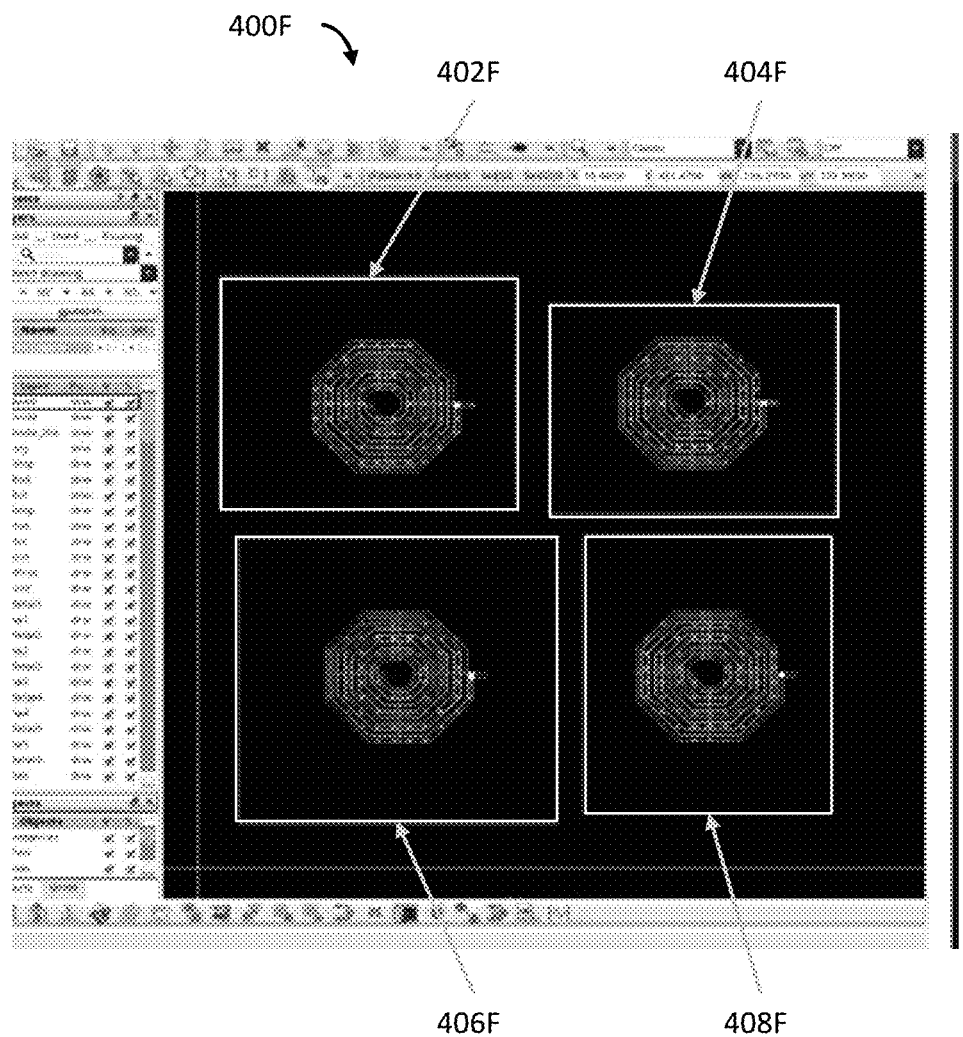

FIG. 4F illustrates an example layout window 400F showing the four inductor instances that have been installed into their respective clusters with their corresponding boundaries 402F, 404F, 406F, and 408F as a result of the execution of the Create Boundary command 400E illustrated in FIG. 4E.

Figure 4G:
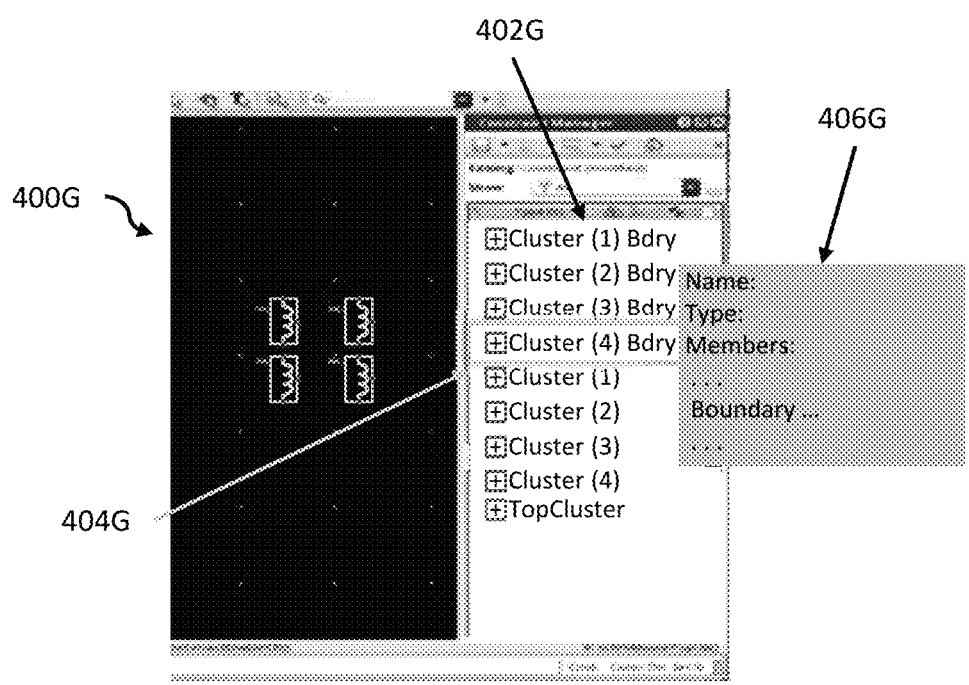

FIG. 4G illustrates an example of back annotating information pertaining to the boundaries created for the clusters as show in FIG. 4F. More specifically, FIG. 4G illustrates a portion of an example schematic or simulation view window 400G with the back-annotated information 404G that includes not only the information pertaining to clusters (e.g., "Cluster (1)," "Cluster (2)," "Cluster (3)," "Cluster (4)," and "TopCluster") as shown in FIG. 4D but also the additional information pertaining to the boundaries (e.g., "Cluster (1) Bdry," "Cluster (2) Bdry," "Cluster (3) Bdry," and "Cluster (4) Bdry" in 404G). Similar to the individual piece of back-annotated information pertaining to a specific cluster, a context window 406G may also be displayed to display additional details about a specific piece of boundary information.

Figure 4H:
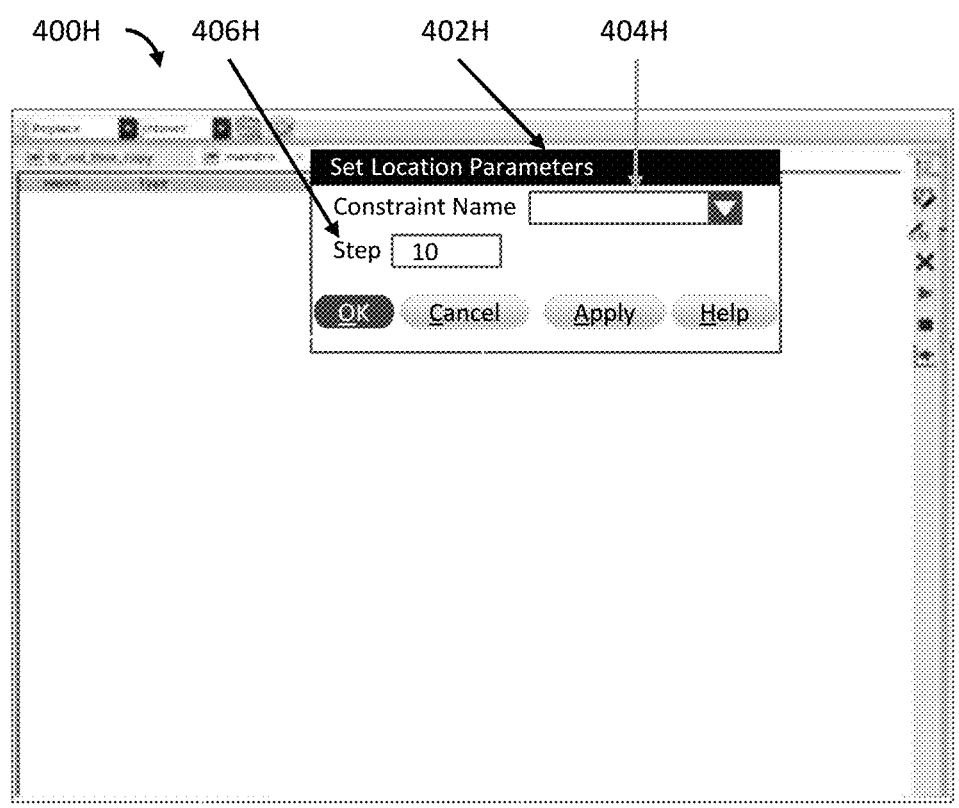

FIG. 4H illustrates an example portion of an analysis engine user interface 400H that includes a configuration menu 402H for configuring location parameters (e.g., the aforementioned _rtmXLoc, _rtmYLoc, etc. parameters). If a user opts for manually configure multiple values for a specific constraint (e.g., a specific constraint that is created via the Create Spreading Constraint command 402B and may be identified from the pulldown menu 404H) for the analysis engine to sweep across, the user may override a default number of steps 406H (e.g., 10 steps to sweep between the minimum value and the maximum value).

Figure 4I:
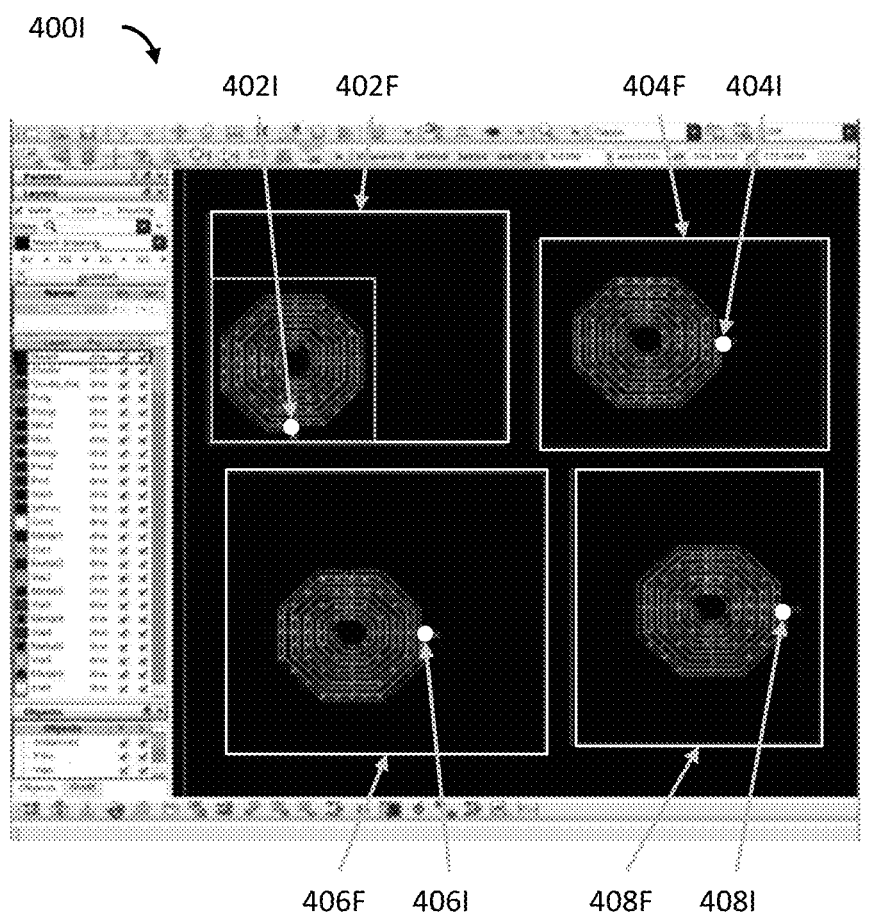

FIG. 4I illustrates an example layout user interface 400I after an analysis engine performs one or more analyses for the simplified layout having four inductor instances. More specifically, FIG. 4I illustrates that each of the four inductor instances, after the one or more analyses, are respectively placed and oriented within their corresponding clusters. For example, the first instance 402I is oriented downward or R270 at a first location relative to the origin of the first cluster 402F; the second instance 404I is oriented at R0 at a second location relative to the origin of the second cluster 404F; the third instance 406I is oriented at R0 at a third location relative to the origin of the third cluster 406F; and the fourth instance 408I is oriented at R0 at a fourth location relative to the origin of the fourth cluster 408F.

Figure 4J:
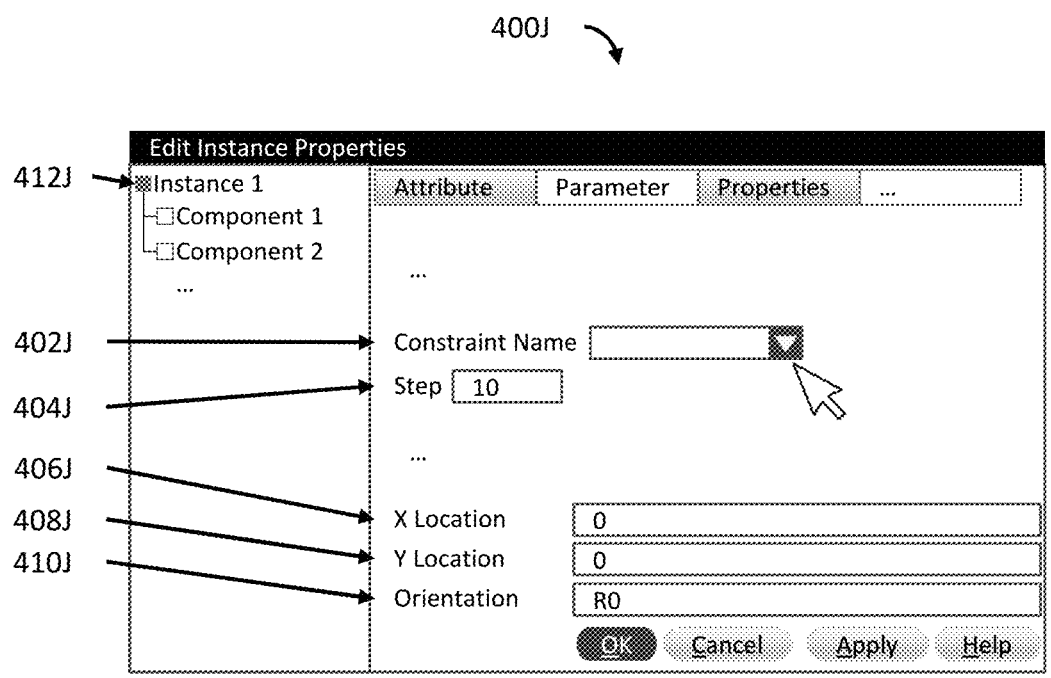

FIG. 4J illustrates an example user interface menu 400J for a user to view and/or edit properties, characteristics, or attributes of an instance. For example, the example user interface menu 400J includes a list of instances 412J that may be selected for viewing or editing, the constraint(s) 402J to which the instance is subject, the total number of steps 404J for sweeping the parameter corresponding to the constraint(s), the X-location (e.g., relative to the origin of the corresponding cluster) 406J of the instance, the Y-location (e.g., relative to the origin of the corresponding cluster) 408J of the instance, and the orientation (e.g., R0 in the example shown in FIG. 4J). Other attributes, characteristics, properties, etc. pertaining to an instance or sub-components thereof may also be included in the example user interface menu 400J in some of these embodiments.

Figure 4K:
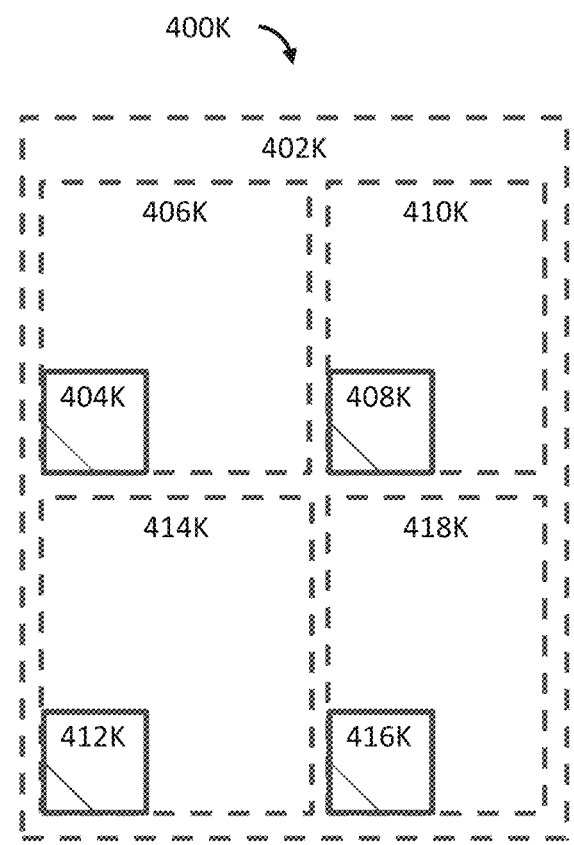

FIG. 4K illustrates a simplified example 400K of four instances that are respectively encapsulated in their corresponding clusters as well as the top cluster that encapsulates the four individual clusters. More specifically, FIG. 4K illustrates the default placement or installation of instances into their respective clusters (e.g., at the respective origins of the clusters). For example, FIG. 4K illustrates that the first instance 404K is currently placed at the origin (e.g., the lower left-hand vertex) of the first cluster 406K; the second instance 408K is currently placed at the origin (e.g., the lower left-hand vertex) of the second cluster 410K; the third instance 412K is currently placed at the origin (e.g., the lower left-hand vertex) of the third cluster 414K; and the fourth instance 416K is currently placed at the origin (e.g., the lower left-hand vertex) of the fourth cluster 418K. FIG. 4K further illustrates an example top cluster 402K that encapsulates the four individual clusters 406K, 410K, 414K, and 418K. It shall be noted that the use of schematic-like graphic symbols 404K, 408K, 412K, and 416K is for the ease of illustration and readability although the example view 400K is in a portion of a layout.

Figure 4L:
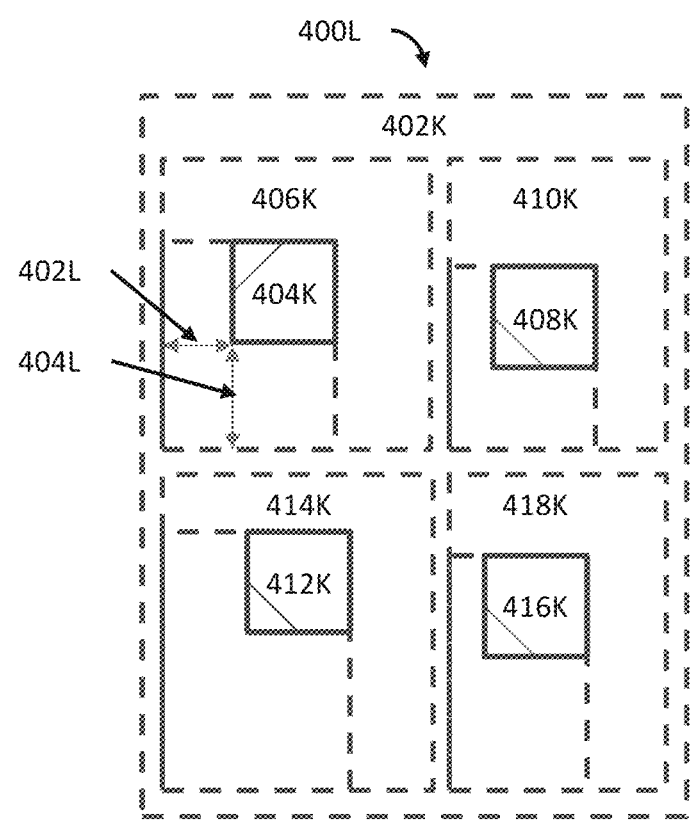

FIG. 4L illustrates another simplified example 400L of the four instances that are respectively encapsulated in their corresponding clusters as well as the top cluster that encapsulates the four individual clusters. More specifically, FIG. 4L illustrates a simplified example of post-optimization of the placement and orientation of the four instances in their respective clusters. For example, FIG. 4L illustrates that the first instance 404K is placed at a first location relative to the origin of the first cluster 406K; the first instance 404K is oriented at R270; the second instance 408K is currently placed at the second location relative to the origin of the second cluster 410K; the third instance 412K is placed at the third location relative to the origin of the third cluster 414K; and the fourth instance 416K is placed at the fourth location relative to the origin (e.g., the lower left-hand vertex) of the fourth cluster 418K. FIG. 4L also illustrates the example top cluster 402K that encapsulates the four individual clusters 406K, 410K, 414K, and 418K. It shall also be noted that the use of schematic-like graphic symbols 404K, 408K, 412K, and 416K is for the ease of illustration and readability although the example view 400L, like the example view 400K, is also in a portion of a layout.

Figure 4M:
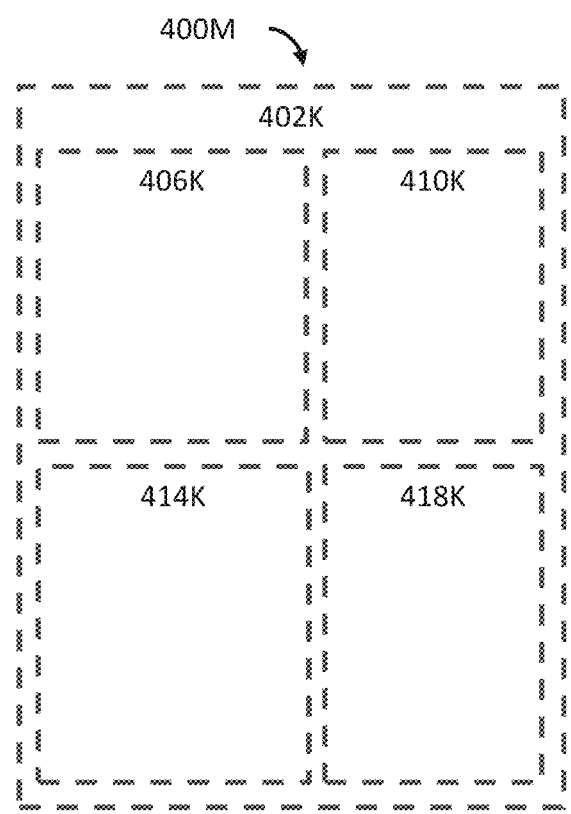

FIG. 4M illustrates the individual clusters 406K, 410K, 414K, and 418K as well as the top cluster 402K. Information pertaining to each of these clusters may be back annotated to a simulation view or a schematic view so that an analysis or simulation engine is made aware of these clusters in sweeping across multiple values of a new parameter.

In various embodiments, a simulator referred to herein comprises a combination of software and hardware module and/or a software module that functions in tandem with a plurality of computer hardware components (e.g., microprocessor(s), memory, etc.) and is provisioned with the capability to sweep across layout structures in an electronic design (e.g., a layout), values of parameters and variables pertaining to the electronic design (e.g., a layout, a schematic, and/or a view thereof, etc.) In some of these embodiments, a first requirement controlling spacing and/or orientation of two or more adjacent instances of the same or different circuit components may be identified. The spacing requirement may require, for example, an allowable range of continuous values (e.g., 25 nm to 165 nm) or a set of discrete values (e.g., 0 nm, 25 nm, 32 nm, 65 nm, 109 nm, etc.) between two immediately neighboring instances in some embodiments. In some of these embodiments, a zero (0) spacing value indicates that two immediately neighboring instances are to be abutted against each other with one of more pins in one instance aligned with one or more corresponding pins in the other instance.

A group of multiple instances subject to the first requirement is identified. These instances (e.g., a parameterized cell or pcell instance) may be identical instances instantiated from the same master in some embodiments or may include at least two instances instantiated from two different masters in some other embodiments. For each of these multiple instances, a cluster or cell having a corresponding boundary may be determined. A cluster or cell may also be referred to as an encapsulating parameterized cell or pcell instance when the encapsulating parameterized cell or pcell is implemented as a parameterized cell or pcell.

In some embodiments, an encapsulating parameterized cell or pcell may include, inter alia, a plurality of new parameters (e.g., Component Description Format or CDF parameters) that includes, for example, an X-location parameter (e.g., _rtmXLoc), a Y-location parameter (e.g., _rtmYLoc), and an orientation parameter (e.g., _rtmOrient). Each of these three new parameters may correspond to a set of discrete values or a range of continuous values. For example, the_rtmXLoc parameter may correspond to a range of values between 28-nm and 110-nm or a set of discrete values such as {28-nm, 35-nm, 48-nm, 65-nm, . . . }; and the_rtmOrient parameter may correspond to a set of permissible orientations such as R0 (no rotation), R90 (rotations by 90 degrees), R180 (rotations by 180 degrees), and R270 (rotations by 270 degrees). An instance enclosed within an encapsulating parameterized cell or pcell may thus be "moved" within an encapsulating parameterized cell or pcell according to the range or set of values. For example, a simulator may respectively apply a value in the set or range of values bounded by the encapsulating parameterized cell or pcell to each parameter in the parameterized cell or pcell, perform the simulation, and proceed to the next value in the set or range.

In some embodiments, an encapsulating parameterized cell or pcell (or simply a cluster or a cell) includes an artificially defined polygonal region that fully encloses an instance therefor and is represented by the corresponding boundary. In some embodiments, a cluster or cell may be automatically determined based at least in part upon, for example, a legal placement region for the instance therefor as well as the size of the instance. In some embodiments, a cluster or cell may be automatically determined based at least in part upon, for example, one or more spacing constraints and/or an orientation constraint. For example, an instance may be subject to the permissible orientation of R0 (no rotation) and R180 (rotation by 180 degrees) and a spacing requirement of 25 nm to 110 nm from immediately neighboring instance(s).

It shall be noted that an encapsulating parameterized cell or pcell is artificially introduced to enclose a parameterized cell or pcell yet does not disturb the original hierarchy of the electronic design (e.g., schematic and/or layout) in some embodiments. That is, an encapsulating parameterized cell or pcell does not add a hierarchical level to the electronic design in these embodiments where the electronic design is flattened to the hierarchical level at which an instance for which the encapsulating parameterized cell or pcell is introduced is located.

In some embodiments, a group of multiple instances is artificially introduced for each instance of the set of multiple instances subject to the first requirement. Each instance in the set of multiple instances subject to the first requirement is enclosed by a respective encapsulating parameterized cell or pcell. The respective boundaries of the multiple respective encapsulating parameterized cells or pcells may be identical in some embodiments or may comprise two or more different encapsulating parameterized cells or pcells in some other embodiments, regardless of whether the corresponding enclosed instances are identical or different.

In some embodiments, the boundary may be custom defined by a user by, for example, precisely specifying the size, shape, and/or dimensions of the boundary or by approximately or even randomly specifying the boundary by drawing a polygonal shape in the user interface. In some embodiments, various techniques described herein may automatically determine the correct boundary based at least in part upon one or more constraints. For example, various techniques may automatically, programmatically determine a correct, legal boundary for an encapsulating parameterized cell or pcell based at least in part upon a permissible legal placement region for the instance enclosed in the encapsulating parameterized cell or pcell in some embodiments. In some of these embodiments, various techniques may programmatically, automatically determine a correct boundary for an encapsulating parameterized cell or pcell based at least further in part upon one or more neighboring instances or one or more neighboring encapsulating parameterized cells or pcells. For example, if the set of multiple instances subject to a foundry-imposed spacing constraint comprises two instances that are to be placed side by side, various techniques may automatically generate two encapsulating parameterized cells or pcells—one for each instance. Moreover, various techniques may determine these two encapsulating parameterized cells or pcells by ensuring that the opposing boundary segments of these two encapsulating parameterized cells or pcells are spaced apart at the required minimum spacing value.

In addition to introducing one encapsulating parameterized cell or pcell for each instance of the set of multiple instances, some embodiments may further introduce another encapsulating parameterized cell or pcell that is a collection of individual encapsulating parameterized cells or pcells for the set of multiple instances. For example, if the set of multiple instances includes instance I1, I2, I3, and I4, some embodiments create an encapsulating parameterized cell or pcell C1 for I1, C2 for I2, C3 for I3, and C4 for I4. Each of the instances I1 through I4 may then be installed into its corresponding encapsulating parameterized cell or pcell. In addition, these embodiments further create a top encapsulating parameterized cell or pcell CR into which each of C1 through C4 is installed. An example function to encapsulate a parameterized cell or pcell may include the following code in SKILL:

_rtmCompleteCell(SrcLibName srcCellName srcViewName desLibNamt

Information pertaining to the encapsulating parameterized cells or pcells may then be back annotated to a schematic view. For example, the parameter(s) and parameter value(s) (e.g., the minimum distance and the maximum distance in both X-direction and Y-direction, a set of discrete values for each direction, etc.) pertaining to a corresponding encapsulating parameterized cell or pcell for an instance may be back annotated to a schematic view. An example SKILL function to automatically create, for example, X-location parameter, Y-location parameter, the minimum value, and the maximum value may include:

rtmGenerateAslSetParameters(axlSession constrainName stepValue)

With the back-annotated information for an instance in the schematic view, a simulator may automatically create a corresponding parameter to sweep across the values between the minimum distance and the maximum distance for the instance during a simulation. For example, a simulator may invoke a layout generation function that specifies the device parameter(s) and the additional parameter(s) introduced by the first requirement. In the aforementioned example of a foundry-imposed spacing requirement, the layout generation function may automatically place an origin at, for example, the lower-left corner of an encapsulating parameterized cell or pcell and use the X-location and Y-location as offsets from the origin to place the instance in the encapsulating parameterized cell or pcell. An example SKILL function to generate a layout may include the following code/pseudocode:

rtmGenerateConstraintLayout(axlSession ciConstrainName variables @optional (layViewName "layout") (openLayoutView nil))

It shall be noted that other similar functions like the example functions provided above may handle any parameters or variables (and their corresponding sets or ranges of values) not captured, reflected, or represented in an electronic design or an instance therein. Moreover, a function described herein may handle not only such parameters or variables not captured, reflected, or represented in an electronic design but also any other parameters, variables, etc. of a device that is actually captured, represented, or reflected in an electronic design or a model therein. For example, any of the aforementioned example functions may handle both the spacing parameters, orientation parameters, etc. introduced by the first requirement as well as real device parameters in some embodiments. An example for generating a layout having four instances subject to the aforementioned spacing constraint include the following code/pseudocode:

_rtmGenerateConstraintLayout(axlGetWindowSession( )
      "Constr_1"
      list(list(nil 'name "L0" 'params list(list(nil 'name "_rtmXLoc" 'value 5.)
      list(nil 'name "_rtmYLoc" 'value 10.)))
        list(nil 'name "L1" 'params list(list(nil 'name "_rtmXLoc" 'value 15.)
        list(nil 'name "_rtmYLoc" 'value 20.)))
        list(nil 'name "L2" 'params list(list(nil 'name "_rtmXLoc" 'value 25.)
        list(nil 'name "_rtmYLoc" 'value 30.)))
        list(nil 'name "L3" 'params list(list(nil 'name "_rtmXLoc" 'value 35.)
        list(nil 'name "_rtmYLoc" 'value 40.))))
      "myLayoutName" t)

With various techniques described herein, a design may thus model an electronic design in real-time while enabling a simulator to sweep across a range of values or a set of discrete values for a parameter or variable pertaining to a circuit component to characterize the behaviors of the circuit component at each of the values, regardless of whether the parameter or variable is actually captured, reflected, or represented in the electronic design or a model therein.

Moreover, with the techniques described herein, designers no longer need to proceed through the conventional iterative loop of schematic design implementation, layout generation, layout extraction, back-annotation of extracted layout information into the schematic design or a simulation view, simulation to find errors, performing fixes for the errors in the schematic or simulation view, and repeat the aforementioned loop over and over again. Instead, designers may simply define one or more new parameters or variables with one or more corresponding sets or ranges of values to allow the simulator to sweep across these one or more new parameters or variables to implement or even optimize the electronic design at least for the one or more new parameters or variables in one single loop. As a result, these techniques described herein improve conventional design by not only providing additional capabilities for sweeping across any parameters or variables (regardless of whether these parameters or variables are actually represented, captured, or reflected in the electronic design) but also conserving computing resources by avoiding unnecessary iterations as well as shortening the design cycle of electronic design implementations.

System Architecture Overview

Figure 5:
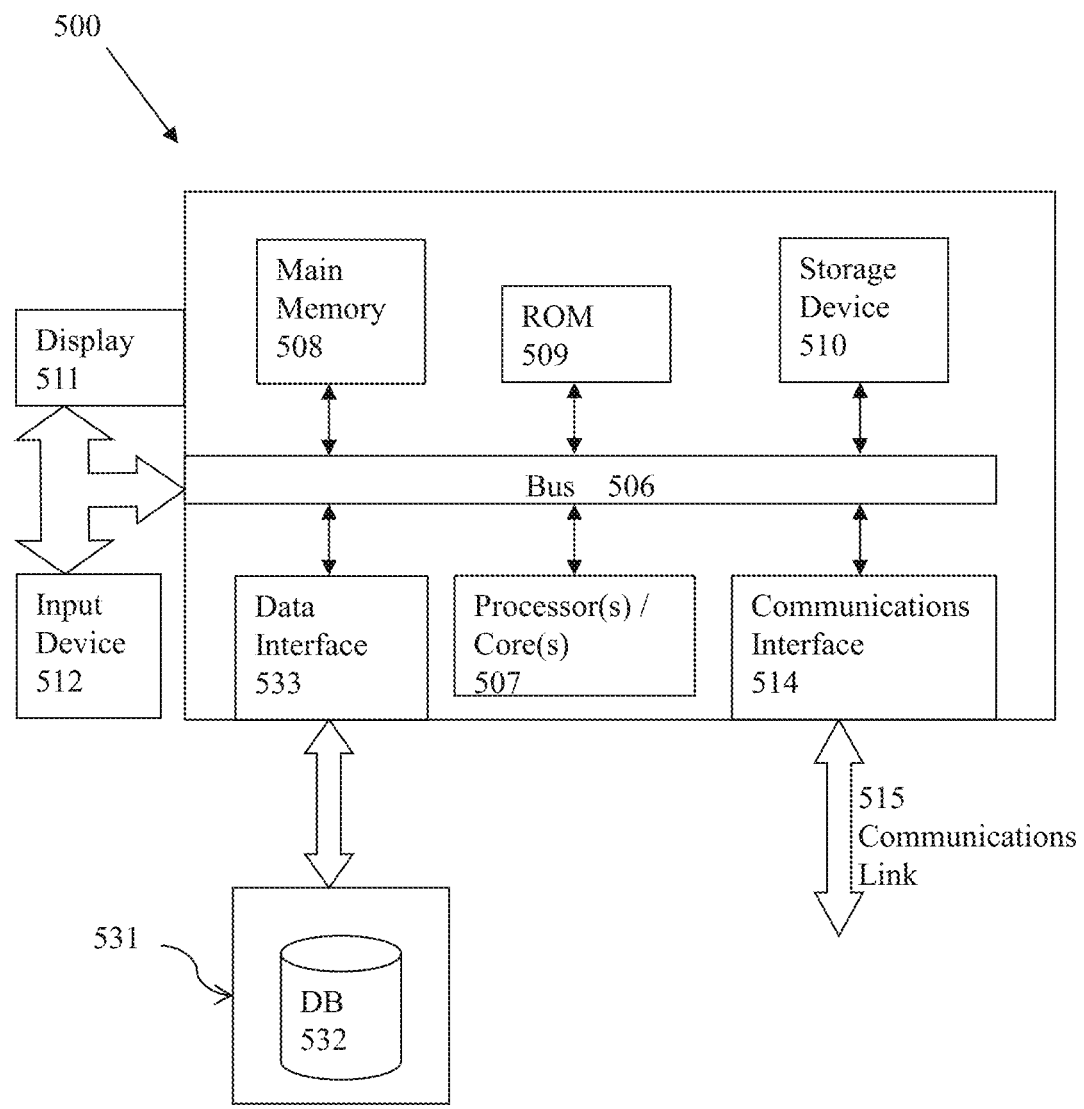
FIG. 5 illustrates a computerized system on which a process for characterizing an electronic design with real-time modeling may be implemented.

FIG. 5 illustrates a computerized system on which a method for characterizing an electronic design with real-time modeling may be implemented. Computer system 500 includes a bus 506 or other communication module for communicating information, which interconnects subsystems and devices, such as processor 507, system memory 508 (e.g., RAM), static storage device 509 (e.g., ROM), disk drive 510 (e.g., magnetic or optical), communication interface 514 (e.g., modem or Ethernet card), display 511 (e.g., CRT or LCD), input device 512 (e.g., keyboard), and cursor control (not shown).

The illustrative computing system 500 may include an Internet-based computing platform providing a shared pool of configurable computer processing resources (e.g., computer networks, servers, storage, applications, services, etc.) and data to other computers and devices in a ubiquitous, on-demand basis via the Internet in some embodiments. For example, the computing system 500 may include or may be a part of a cloud computing platform (e.g., a public cloud, a hybrid cloud, etc.) where computer system resources (e.g., storage resources, computing resource, etc.) are provided on an on-demand basis, without direct, active management by the users in some embodiments.

According to one embodiment, computer system 500 performs specific operations by one or more processor or processor cores 507 executing one or more sequences of one or more instructions contained in system memory 508. Such instructions may be read into system memory 508 from another computer readable/usable storage medium, such as static storage device 509 or disk drive 510. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 507, where the one or more processors, one or more processor cores, or combination thereof executes one or more threads. For example, the acts of determination, extraction, simulating, annotating, analyzing, optimizing, and/or identifying, etc. descried herein may be performed by one or more processors, one or more processor cores, or combination thereof.

The term "computer readable storage medium" or "computer usable storage medium" as used herein refers to any non-transitory medium that participates in providing instructions to processor 507 for execution. Such a medium may take many forms, including but not limited to, non-volatile media and volatile media. Non-volatile media includes, for example, optical or magnetic disks, such as disk drive 510. Volatile media includes dynamic memory, such as system memory 508. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 500. According to other embodiments of the invention, two or more computer systems 500 coupled by communication link 515 (e.g., LAN, PTSN, or wireless network) may perform the sequence of instructions required to practice the invention in coordination with one another.

Computer system 500 may transmit and receive messages, data, and instructions, including program (e.g., application code) through communication link 515 and communication interface 514. Received program code may be executed by processor 507 as it is received, and/or stored in disk drive 510, or other non-volatile storage for later execution. In an embodiment, the computer system 500 operates in conjunction with a data storage system 531, e.g., a data storage system 531 that includes a database 532 that is readily accessible by the computer system 500. The computer system 500 communicates with the data storage system 531 through a data interface 533. A data interface 533, which is coupled to the bus 506 (e.g., memory bus, system bus, data bus, etc.), transmits and receives electrical, electromagnetic or optical signals that include data streams representing various types of signal information, e.g., instructions, messages and data. In embodiments of the invention, the functions of the data interface 533 may be performed by the communication interface 514.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

Various example embodiments of the invention are described herein. Reference is made to these examples in a non-limiting sense. The examples described herein are provided to illustrate more broadly applicable aspects of the invention. Various changes may be made to any of the examples or embodiments described herein, and equivalents thereof may be substituted without departing from the true spirit and scope of these examples or embodiments described herein.

In addition, many modifications may be made to adapt a particular situation, material, composition of matter, system, module, process, and/or process act(s) or step(s) to the objective(s), spirit or scope of the present disclosure. Further, as will be appreciated by those with skill in the art, each of the individual variations, examples, and/or embodiments, etc. described and illustrated herein has discrete components and features which may be readily separated from or combined with the feature or features of any of the other several variations, examples, and/or embodiments, etc., without departing from the scope or spirit of various variations, examples, and/or embodiments, etc. described herein. All such modifications are intended to be within the scope of claims associated with this disclosure. Moreover, various embodiments or portion(s) thereof described herein may be combined to provide further embodiments. Any aspects of the embodiments may be modified, if necessary, to employ concepts of the various variations, examples, and/or embodiments, etc. described herein to provide yet further embodiments.

I claim:

1. A computer implemented method for characterizing an electronic design with real-time modeling, comprising:
  preparing an electronic design for an analysis that programmatically sweeps across multiple values of a new parameter for multiple instances in the electronic design, wherein the new parameter was identified based on a previous analysis of the electronic design, the new parameter was not identified prior to the previous analysis, and the new parameter corresponds to a constraint that governs an intra-device or an inter-device requirement;
  performing, at an analysis engine stored in memory and function in conjunction with a microprocessor, the analysis on the electronic design at least by adding the new parameter to the analysis engine and by sweeping the new parameter across the multiple values to generate an analysis result; and
  updating the electronic design based at least in part upon the analysis result.

2. The computer implemented method of claim 1, wherein preparing the electronic design comprises:
  preparing a library for the electronic design at least by adding the new parameter to the library; and
  identifying the multiple instances and a constraint that corresponds to multiple legal constraint values.

3. The computer implemented method of claim 2, preparing the electronic design further comprising:
  generating one or more clusters for each instance of the multiple instances; and
  generating a layout for at least the multiple instances based at least in part upon the one or more clusters.

4. The computer implemented method of claim 3, preparing the electronic design further comprising:
  back annotating cluster information pertaining to the one or more clusters to a view of the electronic design, wherein the analysis is performed on the view of the electronic design.

5. The computer implemented method of claim 1, performing the analysis comprising:
  setting the new parameter for the analysis engine based at least in part upon the multiple values of the new parameter; and determining a set of parameters indicative of electromagnetic interactions among at least some of the multiple instances at least by performing a first analysis on the electronic design.

6. The computer implemented method of claim 5, performing the analysis further comprising:
  generating a netlist for the electronic design based at least in part upon the set of parameters; and
  performing the analysis on the electronic design using at least the netlist.

7. The computer implemented method of claim 3, generating the one or more clusters comprising:
  identifying an instance from the multiple instances; and
  determining a boundary for a cluster that encapsulates the instance.

8. The computer implemented method of claim 7, generating the one or more clusters comprising:
  generating the cluster to encapsulate the instance;
  generating a top cluster; and
  installing the cluster into the top cluster.

9. The computer implemented method of claim 3, generating the layout comprising:
  specifying the new parameter and one or more device parameters for the multiple instances; and
  placing the multiple instances into corresponding clusters of the one or more clusters based at least in part upon the new parameter that has been specified to a layout generation module.

10. The computer implemented method of claim 1, performing the analysis on the electronic design using at least a netlist comprising:
  setting the new parameter for the analysis engine based at least in part upon the multiple values of the new parameter;
  determining a set of parameters at least by performing an electromagnetic analysis on the electronic design with the new parameter and the multiple values;
  generating the netlist for the electronic design at least by importing the set of parameters into an original netlist; and
  performing the analysis on the electronic design using at least the netlist.

11. The computer implemented method of claim 1, wherein the new parameter comprises a constraint comprising a spacing rule, parallel run length rule, or an orientation rule.

12. The computer implemented method of claim 1, wherein two or more permissible values for the new parameter are derived from the electronic design based on the previous analysis.

13. A computer program product comprising a non-transitory computer accessible medium storing thereupon a sequence of instructions which, when executed by a processor, causes the processor to perform a set of acts for characterizing an electronic design with real-time modeling, the set of acts comprising:
  preparing an electronic design for an analysis that programmatically sweeps across multiple values of a new parameter for multiple instances in the electronic design, wherein the new parameter was identified based on a previous analysis of the electronic design, the new parameter was not identified prior to the previous analysis, and the new parameter corresponds to a constraint that governs an intra-device or an inter-device requirement;
  performing, at an analysis engine stored in memory and function in conjunction with a microprocessor, the analysis on the electronic design at least by adding the new parameter to the analysis engine and by sweeping the new parameter across the multiple values to generate an analysis result; and
  updating the electronic design based at least in part upon the analysis result.

14. The computer program product of claim 13, the set of acts further comprising:
  preparing a library for the electronic design at least by adding the new parameter to the library;
  identifying the multiple instances and a constraint that corresponds to multiple legal constraint values;
  generating one or more clusters for each instance of the multiple instances;
  generating a layout for at least the multiple instances based at least in part upon the one or more clusters; and
  back annotating cluster information pertaining to the one or more clusters to a view of the electronic design, wherein the analysis is performed on the view of the electronic design.

15. The computer program product of claim 13, the set of acts further comprising:
  setting the new parameter for the analysis engine based at least in part upon the multiple values of the new parameter;
  determining a set of parameters indicative of electromagnetic interactions among at least some of the multiple instances at least by performing a first analysis on the electronic design;
  generating a netlist for the electronic design based at least in part upon the set of parameters; and
  performing the analysis on the electronic design using at least the netlist.

16. The computer program product of claim 14, the set of acts further comprising:
  identifying an instance from the multiple instances;
  determining a boundary for a cluster that encapsulates the instance;
  generating the cluster to encapsulate the instance;
  generating a top cluster; and
  installing the cluster into the top cluster.

17. A system for characterizing an electronic design with real-time modeling, comprising:
  a processor;
  a memory having stored thereupon a sequence of instructions, which when executed by the processor, causes a set of acts comprising:
  preparing an electronic design for an analysis that programmatically sweeps across multiple values of a new parameter for multiple instances in the electronic design, wherein the new parameter was identified based on a previous analysis of the electronic design, the new parameter was not identified prior to the previous analysis, and the new parameter corresponds to a constraint that governs an intra-device or an inter-device requirement;
  performing, at an analysis engine stored in memory and function in conjunction with a microprocessor, the analysis on the electronic design at least by adding the new parameter to the analysis engine and by sweeping the new parameter across the multiple values to generate an analysis result; and
  updating the electronic design based at least in part upon the analysis result.

18. The system of claim 17, the set of acts further comprising:

preparing a library for the electronic design at least by adding the new parameter to the library;

identifying the multiple instances and a constraint that corresponds to multiple legal constraint values;

generating one or more clusters for each instance of the multiple instances;

generating a layout for at least the multiple instances based at least in part upon the one or more clusters; and back annotating cluster information pertaining to the one or more clusters to a view of the electronic design, wherein the analysis is performed on the view of the electronic design.

19. The system of claim 18, the set of acts further comprising:

identifying an instance from the multiple instances;

determining a boundary for a cluster that encapsulates the instance;

generating the cluster to encapsulate the instance;

generating a top cluster; and installing the cluster into the top cluster.

20. The system of claim 17, the set of acts further comprising performing the analysis on the electronic design using at least a netlist, performing the analysis comprising:

setting the new parameter for the analysis engine based at least in part upon the multiple values of the new parameter;

determining a set of parameters at least by performing an electromagnetic analysis on the electronic design with the new parameter and the multiple values;

generating the netlist for the electronic design at least by importing the set of parameters into an original netlist; and performing the analysis on the electronic design using at least the netlist.

\* \* \* \* \*